(12) United States Patent
Nakamura

(10) Patent No.: US 6,977,428 B2
(45) Date of Patent: Dec. 20, 2005

(54) SEMICONDUCTOR DEVICE ADAPTED TO REMOVE NOISE FROM A SIGNAL

(75) Inventor: Akio Nakamura, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 14 days.

(21) Appl. No.: 10/712,090

(22) Filed: Nov. 14, 2003

(65) Prior Publication Data

US 2004/0130014 A1 Jul. 8, 2004

(30) Foreign Application Priority Data

Jan. 7, 2003 (JP) .............................. 2003-000859

(51) Int. Cl.[7] ............................................. H01L 23/02
(52) U.S. Cl. ................... 257/678; 257/737; 257/738; 257/778; 257/787; 438/108; 438/118; 438/126; 438/137; 438/613
(58) Field of Search ............................... 257/737, 738, 257/778, 787; 438/108, 118, 126, 137, 613

(56) References Cited

U.S. PATENT DOCUMENTS 5,849,606 A * 12/1998 Kikuchi et al. ............. 438/108

FOREIGN PATENT DOCUMENTS

| JP | 7-45746 | 2/1995 |
|---|---|---|
| JP | 9-148489 | 6/1997 |
| JP | 2001-118948 | 4/2001 |
| JP | 2001-292026 | 10/2001 |
| JP | 2002-043468 | 2/2002 |
| JP | 2002-198466 | 7/2002 |
| JP | 2001-210743 | 8/2002 |
| JP | 2002-314028 | 10/2002 |

* cited by examiner

Primary Examiner—David Nelms
Assistant Examiner—Mai-Huong Tran
(74) Attorney, Agent, or Firm—Rabin & Berdo, PC

(57) ABSTRACT

What is invented is a semiconductor device (10) comprising a pellet (12) having a ground electrode (18), an outside signal terminal (15) connected to the pellet (12), so as to receive signal which is likely to include noise. Therein, said outside signal terminal (15) is surrounded with a ground terminal (17) connected to said ground electrode (18) in at least a half periphery.

9 Claims, 19 Drawing Sheets

SEMICONDUCTOR DEVICE ADAPTED TO REMOVE NOISE FROM A SIGNAL

BACKGROUND OF THE INVENTION

1. Field of the Invention

The present invention relates to a semiconductor device called area array package comprising connecting sections arrayed in an area like a lattice, such as BGA (Ball Grid Array) or CSP (Chip size package) and its manufacturing method, especially to a semiconductor device to cope with electric signal including noise.

2. Description of Related Art

Today, there is an occasion when computer communication is performed by wireless, such as radio waves or infrared rays. And, demand of this kind of wireless computer communication is comparatively high. To reply to this demand, semiconductor device for wireless communication is manufactured. And, an example of this semiconductor device and its manufacturing method are disclosed in, for example, JP2001-210743. This document discloses a method of manufacturing plural semiconductor devices of different package sizes efficiently. The semiconductor devices of this kind are mounted on mother boards. Plural wiring of a prescribed pattern is formed on a mother board. And, each terminal of the semiconductor device is connected with corresponding portion of the wiring. By way of each terminal, outside signals such as electricity source, operating clock and radio signal obtained via antenna etc. are inputted to said semiconductor device. On the other hand, said semiconductor device puts out various kinds of signals from each terminal to corresponding portion of wiring.

Meanwhile, in the conventional semiconductor device, noise could be included in the outside signal of electricity source, operating clock or radio signal etc. This noise caused error or delay in operation, when outside signal including this noise is inputted to the semiconductor device. Since, any countermeasure is not provided to said semiconductor device.

Therefore, the present invention aimed at providing semiconductor device provided with a countermeasure to the noise included in the outside signal, or occasionally in the inside signal.

SUMMARY OF THE INVENTION

The present invention adopts next configuration to solve problems mentioned above.

What is characterized is a semiconductor device comprising a pellet having a ground electrode, an outside signal terminal connected to the pellet, so as to receive signal which is likely to include noise. Therein, said outside signal terminal is surrounded with a ground terminal connected to said ground electrode in at least a half periphery.

Said outside signal terminal can receive signal by antenna mounted on the apparatus where the semiconductor device is installed.

Said outside signal terminal can receive operating clock from the apparatus where the semiconductor device is installed.

Said outside signal terminal can receive electricity source from the apparatus where the semiconductor device is installed.

Said ground terminal can surround only half of the periphery of said outside signal terminal.

Said semiconductor device can be provided with fixing reinforcement terminal to reinforce the fixing of the semiconductor device to the apparatus installing it.

Said semiconductor device is provided with plural terminals for electrical connection. And, each terminal is projecting at the base of semiconductor device to connect with a socket.

Said semiconductor device is provided with a pair of semiconductor pellets. At the base of one of the semiconductor pellets, the other semiconductor pellet is located. And, electrodes of the other semiconductor pellet can be connected with the plural terminals electrically.

A pair of semiconductor pellets mentioned above are fixed with each other at confronting faces with conductive paste. And, this conductive paste can be electrically connected with said ground terminal.

What is characterized is a manufacturing method of semiconductor device for forming each semiconductor device by separating it from a wafer at mark of each ground terminal having peculiar form. The semiconductor device comprises a pellet having a ground electrode, an outside signal terminal connected to the pellet, so as to receive signal which is likely to include noise, and plural terminals for inputting and outputting signals. And, the semiconductor device is sealed in a resin as one body. Therein, said outside signal terminal is surrounded with a ground terminal connected to said ground electrode in at least a half periphery. The ground terminal has a peculiar form. And, each ground terminal is exposed at the base of resin portion, after sealing each pellet located at the top of corresponding terminal in the resin portion.

Said pellet can be located at a prescribed position with recognizing mark of the ground terminal.

Each ground terminal exposed at the base of the resin portion can be formed from one side of both surface of conductive board material, before locating said pellet.

A buffer layer having same rate of expansion as the material of the apparatus to install the semiconductor device can be formed at one side of the conductive board material, after forming said each terminal on said board material.

Each terminal can be separated electrically by polishing said board material at the other face of board material until said buffer layer appears, after forming said buffer material.

A solder layer can be formed at one face of the conductive board material, after forming said each terminal on said board material.

Each terminal can be separated electrically by polishing said board material at the other face of the board material until said solder layer appears, after forming said solder layer.

Each connecting portion is formed with remaining solder with its surface tension at each terminal projecting at the base of said resin portion when said solder layer is melted to remove, after sealing the pellet in the resin.

DESCRIPTION OF THE PREFERRED EMBODIMENTS

Hereafter, embodiments preferred by the inventor of the present invention will be described with reference to the accompanying drawings.

<Embodiment 1>

Figure 1:
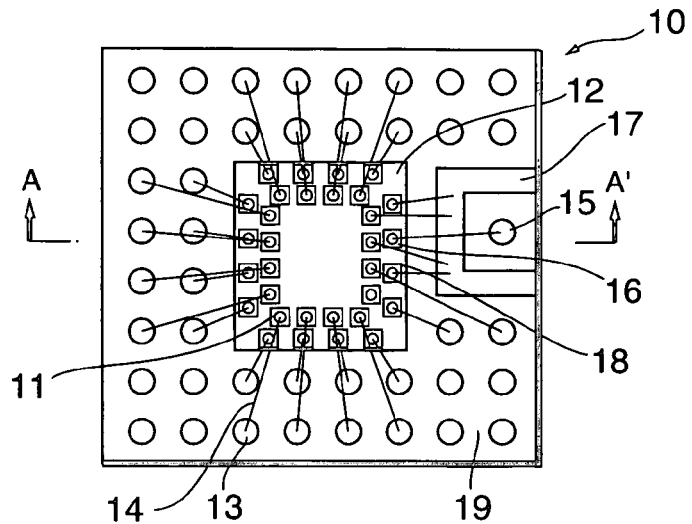
FIG. 1 is a perspective plan view of semiconductor device of Embodiment 1 at a prescribed depth.

FIG. 1 is a plan view at the top of semiconductor device 10 of present invention as looking through it at a prescribed depth.

The semiconductor device 10 of present invention is what is called an area package having terminals arrayed like a lattice, for example, BGA or CSP. The semiconductor device 10 is installed on the surface of a mother board comprising epoxy resin material including glass fiber by the method called solder screen. On the mother board, signal lines for sending and receiving signal for wireless communication are printed. The signal lines are connected with an antenna terminal 15 comprising an outside signal terminal provided to the semiconductor device 10 mentioned later.

The semiconductor device 10 comprises an integrated circuit. It further comprises a pellet 12 having plural electrodes 11 to input and output signals of the integrated circuit. Further, it comprises plural post terminals 13 in forms of columns to install the semiconductor device 10 on the mother board and to input and output various signals. Here, a top end of the post terminals 13 and the electrodes 11 are electrically connected with wires 14 for bonding.

Further, the semiconductor device 10 of the present invention comprises an antenna terminal 15 acting as a kind of outside signal terminal, which is connected to a signal line to send and receive a signal to the antenna. The pellet 12 has an antenna electrode 16 connected with the antenna terminal 15. Besides, the semiconductor device 10 comprises a ground terminal 17 in the form of a square bracket, which surrounds the antenna terminal 15. The pellet 12 has plural ground electrodes 18 connected with the ground terminal 17. These elements of the semiconductor device 10 are sealed in a resin portion 19.

Figure 2:
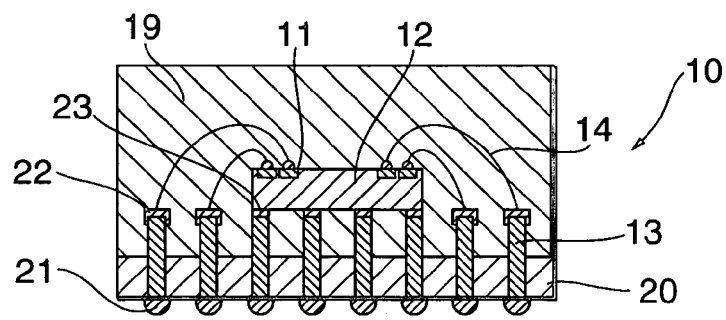
FIG. 2 is a sectional view of semiconductor device of Embodiment 1.

In the base of resin portion 19, as shown in FIG. 2, a buffer layer 20 formed with resin material including glass fiber same as said mother board, is provided. Here, FIG. 2 shows a sectional view of the semiconductor device 10 at the position designated by the line A–A'.

The buffer layer 20 is formed in a prescribed thickness and width with its base coinciding with bases of the terminals 13, 15 and 17.

At the base of buffer layer 20, bottom end surfaces of terminals 13, 15 and 17 appear. And, formed there are connecting portions 21, comprising solders in the forms of balls etc. On the other hand, at the top end of terminals 13, 15 and 17, gilded portions 22 are formed. And, the bottom surface of pellet 12 and top ends of terminals 13 in the central portion of FIG. 2 are bound with binding material 23.

The buffer layer 20 is formed with resin material including glass fiber same as the mother board, as mentioned above. Therefore, the buffer layer 20 expands or shrinks according as the board expands or shrinks. By this, the connecting portion 21 formed at the bottom end surfaces of the terminals 13, 15 and 17, does not peel off from these bottom end surfaces. The reason is that the occurrence of strain at weak portions of binding interface between the bottom end surfaces of the terminals 13, 15 and 17 and the connecting portion; 21 is prevented.

Figure 3:
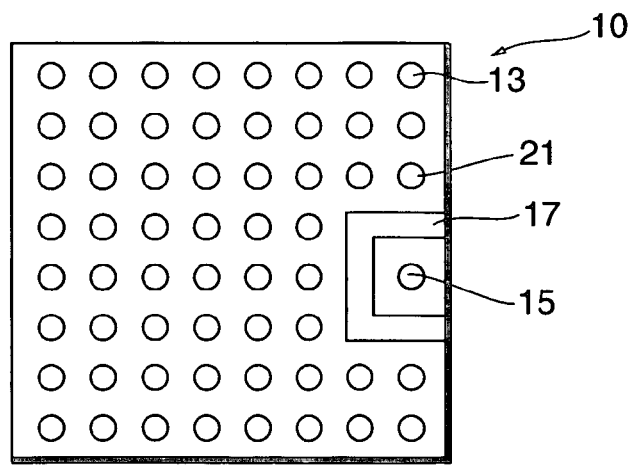
FIG. 3 is a plan view at the base of semiconductor device of Embodiment 1.

Next, the semiconductor device 10 of the present invention is described referring to FIG. 3 showing the semiconductor device 10 at its bottom surface.

The connecting portions 21 mentioned above are arrayed with equal intervals at the bottom surface of the buffer layer 20. That is, post terminals 13 provided with connecting portions 21 are arrayed with equal intervals.

The antenna terminal 15 is positioned at the center of the right end portion of the semiconductor device 10 in the drawings. And, the periphery of antenna terminal 15 is surrounded with the bracket shaped ground terminal 17. At the bottom surfaces of antenna terminal 15 and ground terminal 17 of FIG. 3, connecting portions 21 are formed as well, though not clearly shown in FIG. 3. These can be seen more clearly in FIG. 11 or 12.

When the semiconductor device 10 is installed on the mother board, the ground terminal 17 of this semiconductor device 10 is connected to the ground terminal of the mother board. Therefore, the charge on the antenna terminal 15 is attracted to the ground terminal 17, because the electric potential of this is lower than that of the antenna terminal 15, which is surrounded with the ground terminal 17. According to this, electromagnetic wave in electromagnetic field is attracted to the ground terminal 17. This attracted electromagnetic wave is generally a high frequency wave, that is, noise. This kind of high frequency wave (noise) is known to hinder operation. To avoid this, noise included in the outside signal is removed. Here, as mentioned above, this is performed by attracting the noise to the ground terminal 17 surrounding at least half of the periphery of the antenna terminal 15 from the antenna terminal 15, that is, the outside signal terminal, which receives the outside signal including noise.

As for the means for removal of the noise mentioned above, it is considered as an equivalent of noise removing circuit comprising coil and capacitor known before this invention. Therefore, according to the characteristic of noise, that is, frequency band, inductance of equivalent coil and the capacitance of equivalent capacitor are decided. And, for example, a sectional area of the antenna terminal, a sectional area of the ground terminal, a distance between the antenna terminal and ground terminal, and a kind of material of the resin portion 19 are adequately selected.

As mentioned above, according to the semiconductor device 10 of the present invention, noise included in the signal line connected with the antenna can be removed, because the antenna terminal 15 is surrounded with the ground terminal 17 at its periphery.

Next, the manufacturing method of the semiconductor device 10 of present invention is described referring to the drawings.

Figure 4:
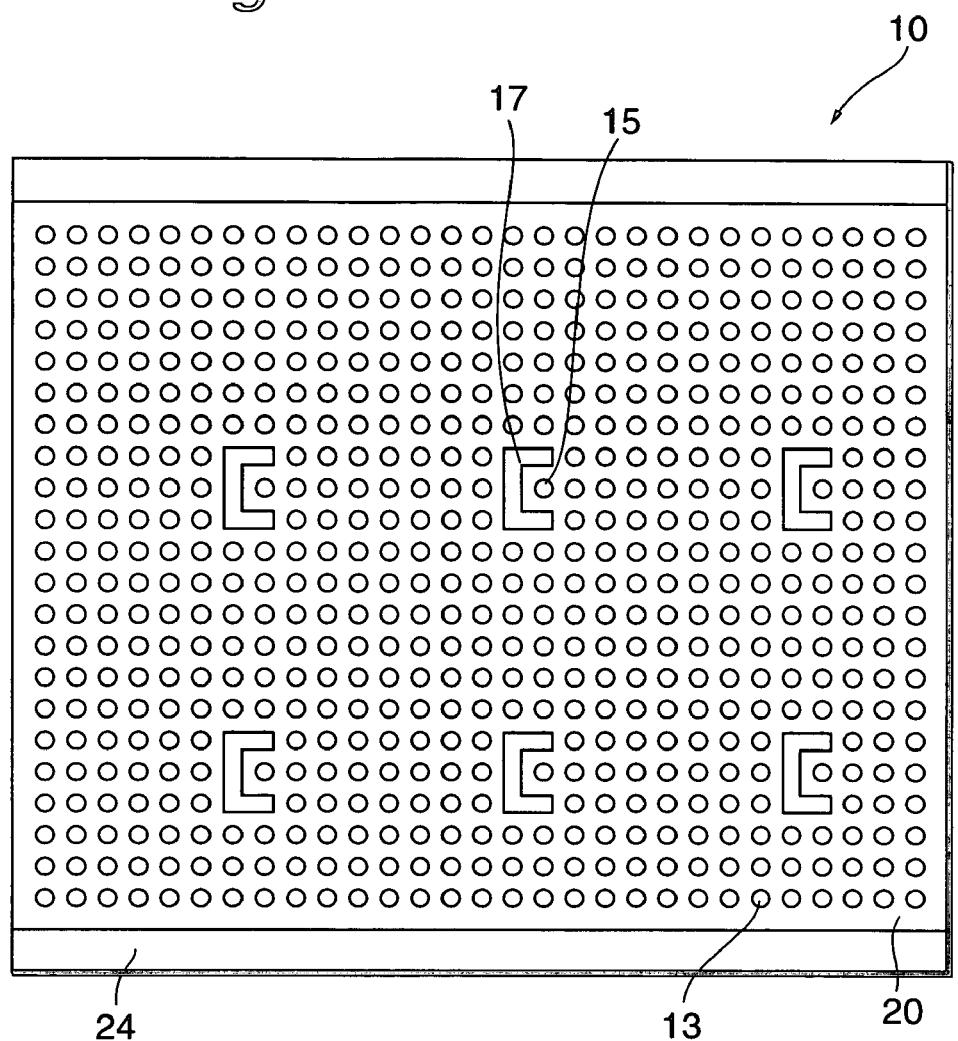
FIG. 4 is a plan view showing each terminal such as ground terminal formed from the board material, and buffer layer; in the manufacturing method of semiconductor device of Embodiment 1.
Figure 5:
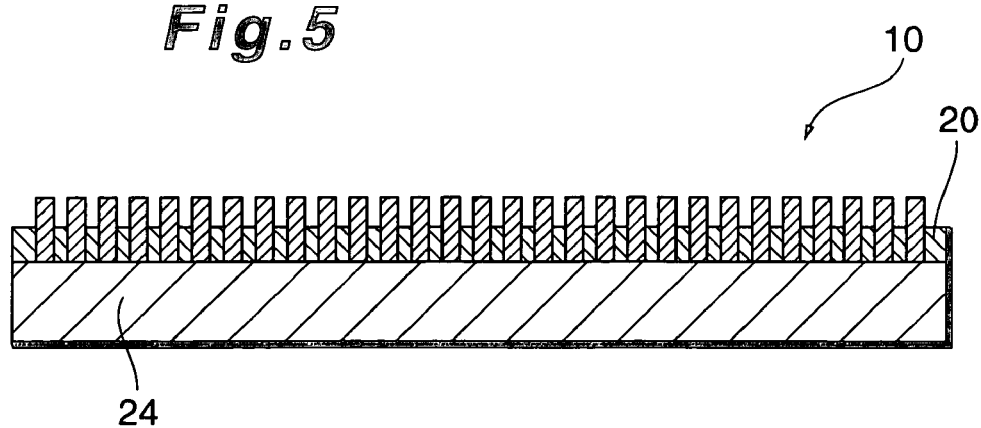
FIG. 5 is a sectional view showing each terminal such as ground terminal formed from the board material, and buffer layer; in the manufacturing method of semiconductor device of Embodiment 1.

As shown in the plan view of FIG. 4 and sectional view of FIG. 5, at the beginning, on one surface of plate material 24 with conductivity comprising chief element of copper, post terminals 13 are formed like a lattice. When the post terminals 13 are formed, a bracket shaped ground terminal 17 and an antenna terminal 15 surrounded with the bracket shaped ground terminal 17 are simultaneously formed on the one surface of the plate material 24.

The plate material 24 has a uniform thickness of 50 μm to 400 μm for example. And, this receives a mask treatment to form terminals 13, 15 and 17. After this treatment, it receives an etching treatment. By this treatment; post terminals 13, an antenna terminal 15, and a ground terminal 17; are formed simultaneously on the plate material 24. The height and width of terminals 13, 15 and 17 are set about one third of the thickness and width of said plate material 24.

In Embodiment 1, as mentioned above, a bracket shaped ground terminal 17 surrounded an antenna terminal 15 in half of its periphery. However, the antenna terminal 15 should preferably be surrounded in all periphery of it. Moreover, the ground terminal 17 should preferably be round shaped without any corner. That is, non-cornered ground terminal such as half circle or full circle etc. is preferable to surround the antenna terminal 15. By this kind of ground terminal, noise in the antenna terminal 15 is more sufficiently reduced. After forming terminals 13, 15 and 17, buffer layer 20 is formed with epoxy resin material including glass fiber same as mother board. And, in this state, top ends of terminals 13, 15 and 17 are projected from resin. After forming buffer layer 20, buffer layer 20 and terminals 13, 15 and 17 projected from it; are cleaned with cleaning water including cleansing material. By this cleaning, needless matter attached when the buffer layer 20 is formed can be removed.

Figure 6:
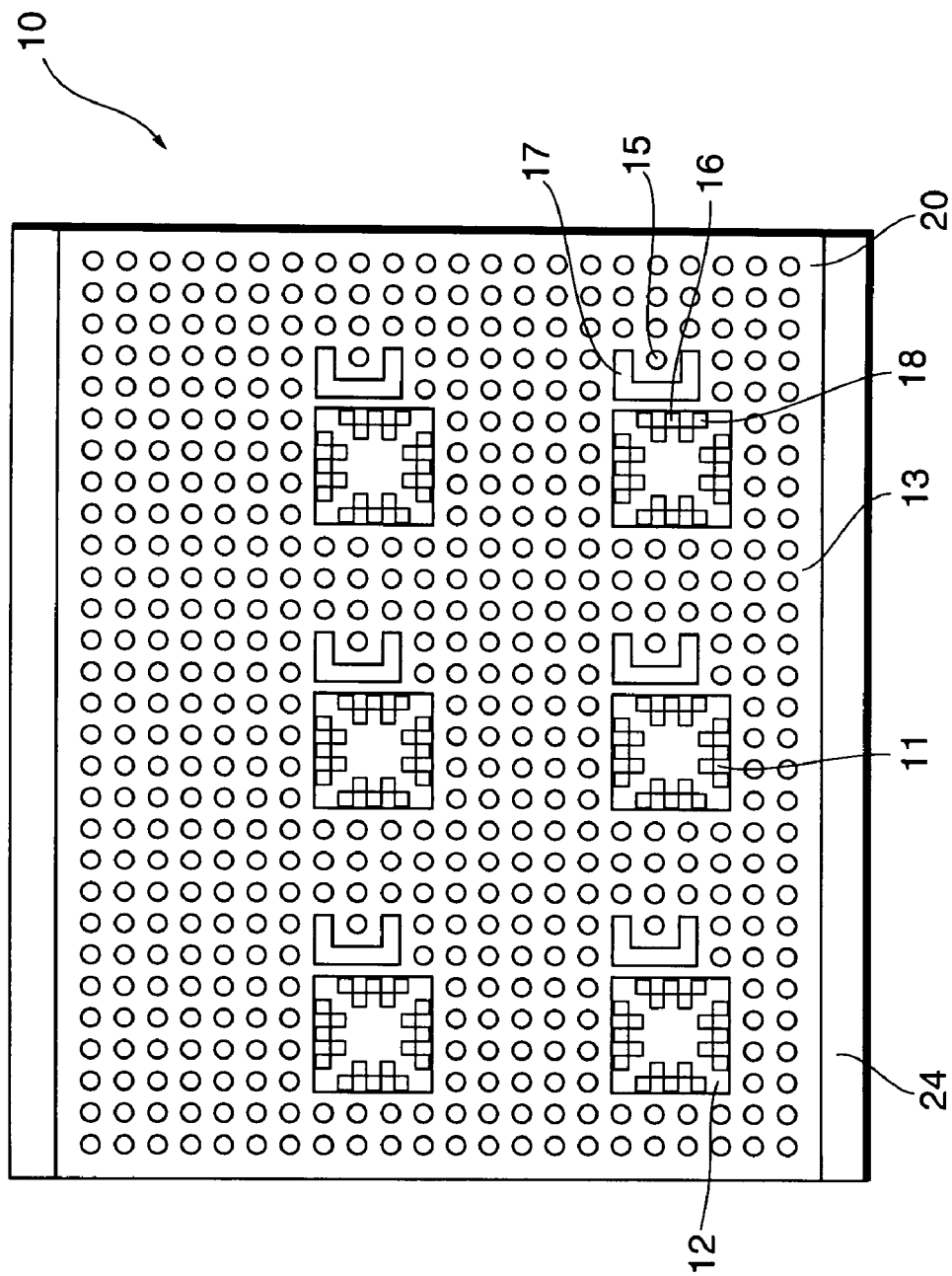
FIG. 6 is a plan view showing pellet located at a prescribed position; in the manufacturing method of semiconductor device of Embodiment 1.
Figure 7:
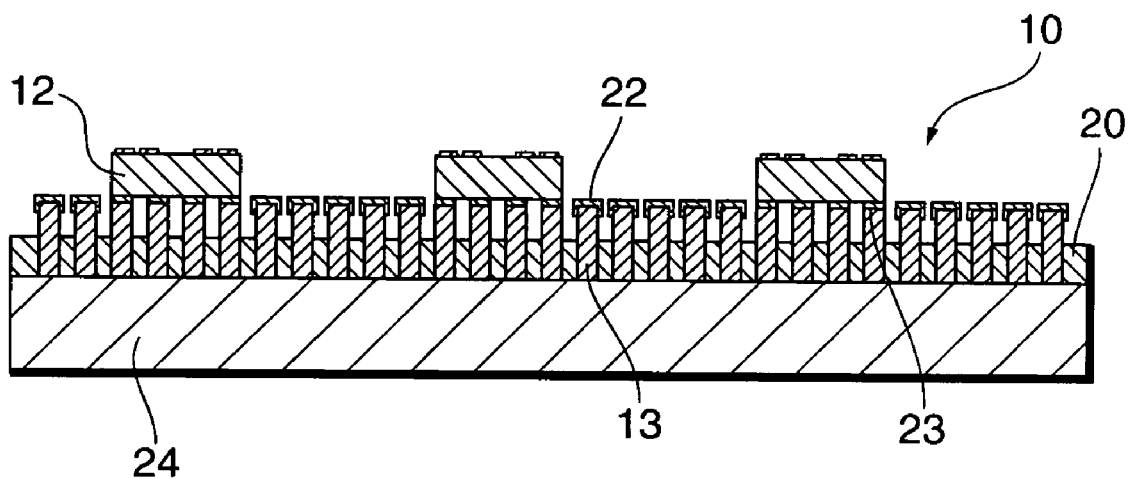
FIG. 7 is a sectional view showing pellet located at a prescribed position; in the manufacturing method of semiconductor device of Embodiment 1.

After removing the needless matter, as shown in the plan view of FIG. 6 and the sectional view of FIG. 7, gilded portion 22 is formed on the top ends of terminals. By forming gilded portion 22, wire 14 is easily connected with terminals 13, 15 and 17 in the wire bonding process mentioned later. And, it can reduce the loss of electricity between terminals 13, 15 and 17; and the wire.

After this process, a pellet 12 manufactured by the method known before the present invention is brought at a prescribed position on the arrayed post terminals 13. In this occasion, the bracket shaped ground terminal discriminated from the other terminals is used as a guide to lead the pellet 12 to the prescribed position. And, the pellet 12 is fixed by binding material 23.

Therefore, by using the ground terminal discriminated from the other terminals as an indicator of positioning, the pellet is positioned in high accuracy.

Figure 8:
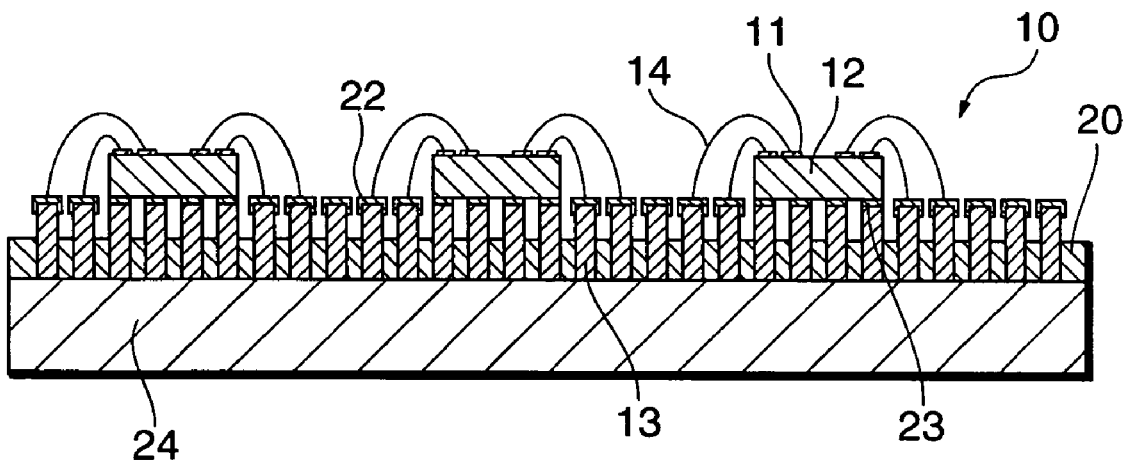
FIG. 8 is a sectional view showing pellet treated wire bonding; in the manufacturing method of semiconductor device of Embodiment 1.

As shown in the sectional view of FIG. 8, after fixing pellet, electrodes of the pellet and their corresponding terminals 13, 15 and 17 are connected with wire.

In this occasion, though not shown in FIG. 8, ground electrode 18 of pellet 12 shown in FIG. 6 and ground terminal 17 are connected with wire. And, antenna electrode 16 and antenna terminal 15 are connected with wire (c.f FIG. 1).

Figure 9:
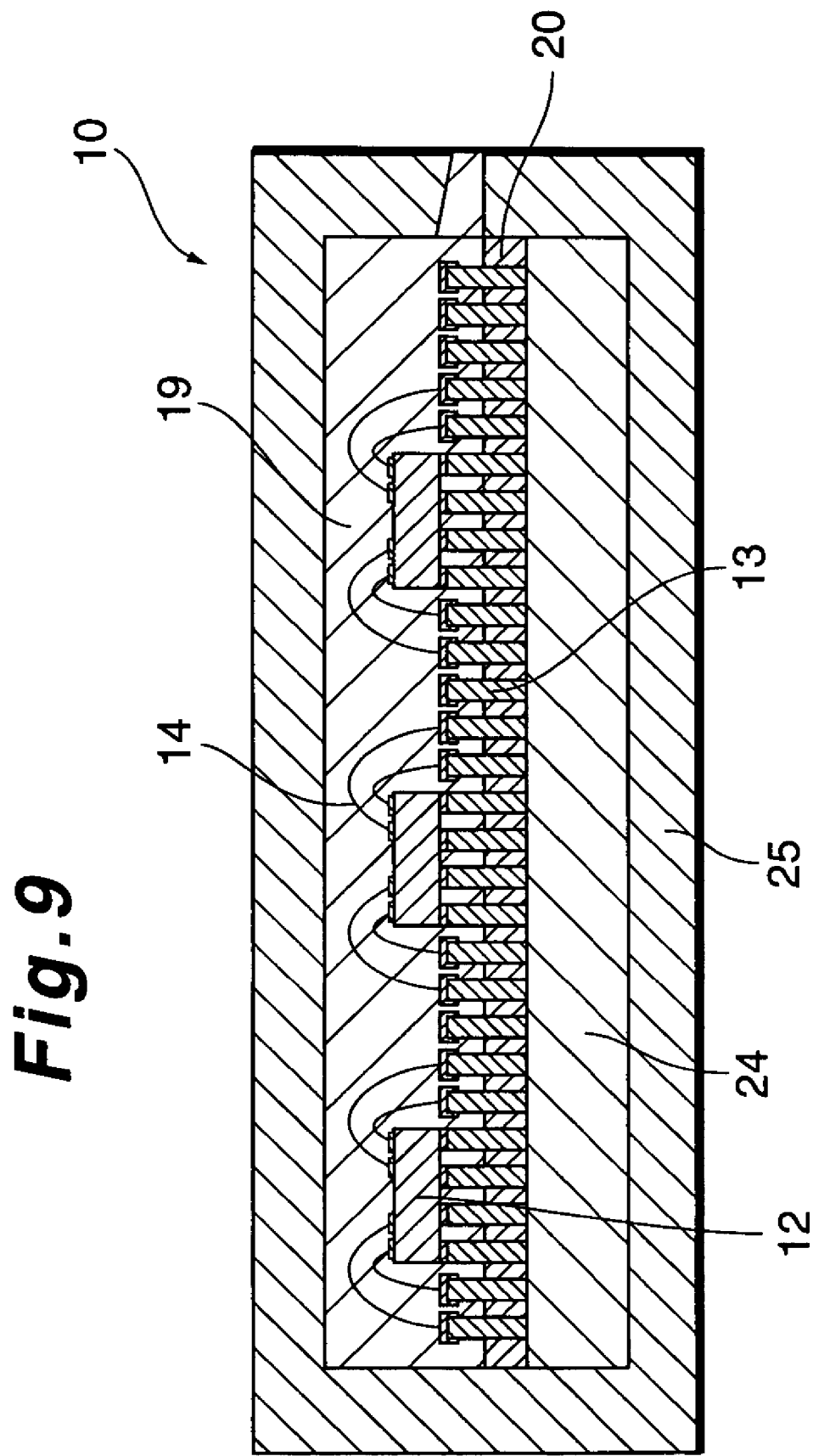
FIG. 9 is a sectional view showing sealed state of resin; in the manufacturing method of semiconductor device of Embodiment 1.

After, performing wire bonding, as shown in the sectional view of FIG. 9, the semiconductor device 10 is set in a metal mold for performing resin material sealing. And, the surface of buffer layer 20, terminals 13, 15 and 17 projected from the buffer layer, pellet 12, and wire 14 are sealed with resin portion 19. By this sealing, resin body sealed plural pellet is formed.

Figure 10:
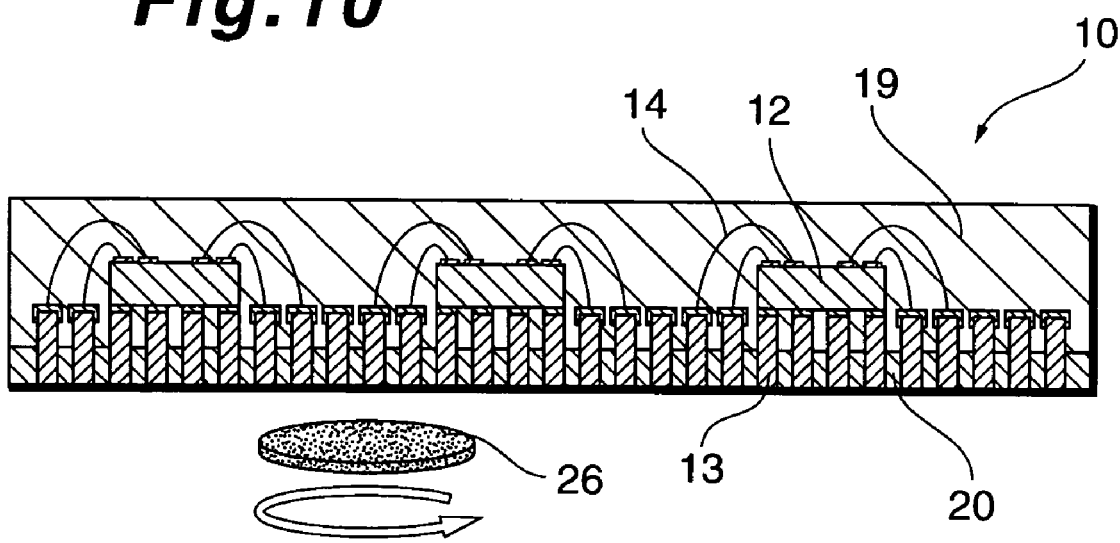
FIG. 10 is a sectional view showing the polishing process; in the manufacturing method of semiconductor device of Embodiment 1.

After forming resin body, this resin body is taken out from a metal mold. Then, the plate material 24 is removed. This is performed, as shown in FIG. 10, by polishing the other face (bottom face) of the plate material with a grinder 26 until bottom ends of terminals 13, 15 and 17 appear. By this polishing of removing plate material 24, end faces of terminals 13, 15 and 17 come out and these terminals 13, 15 and 17 are electrically separated with each other.

Figure 11:
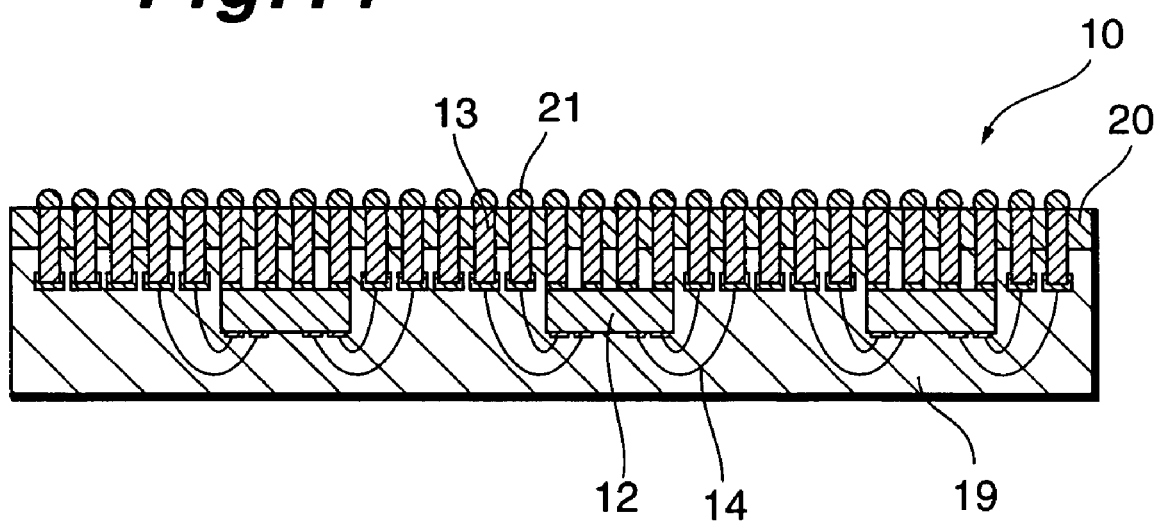
FIG. 11 is a sectional view showing sealed resin body; in the manufacturing method of semiconductor device of Embodiment 1.

After removing the plate material by polishing, as shown in FIG. 11, at the end faces of terminals 13, 15 and 17 formed are connecting portions 21 such as solder balls or surface layers. When connecting portions 21 are formed, the oxide films at the end faces of terminals 13, 15 and 17 are already removed, because the end faces of terminals 13, 15 and 17 have already been polished with a grinder 26.

Figure 12:
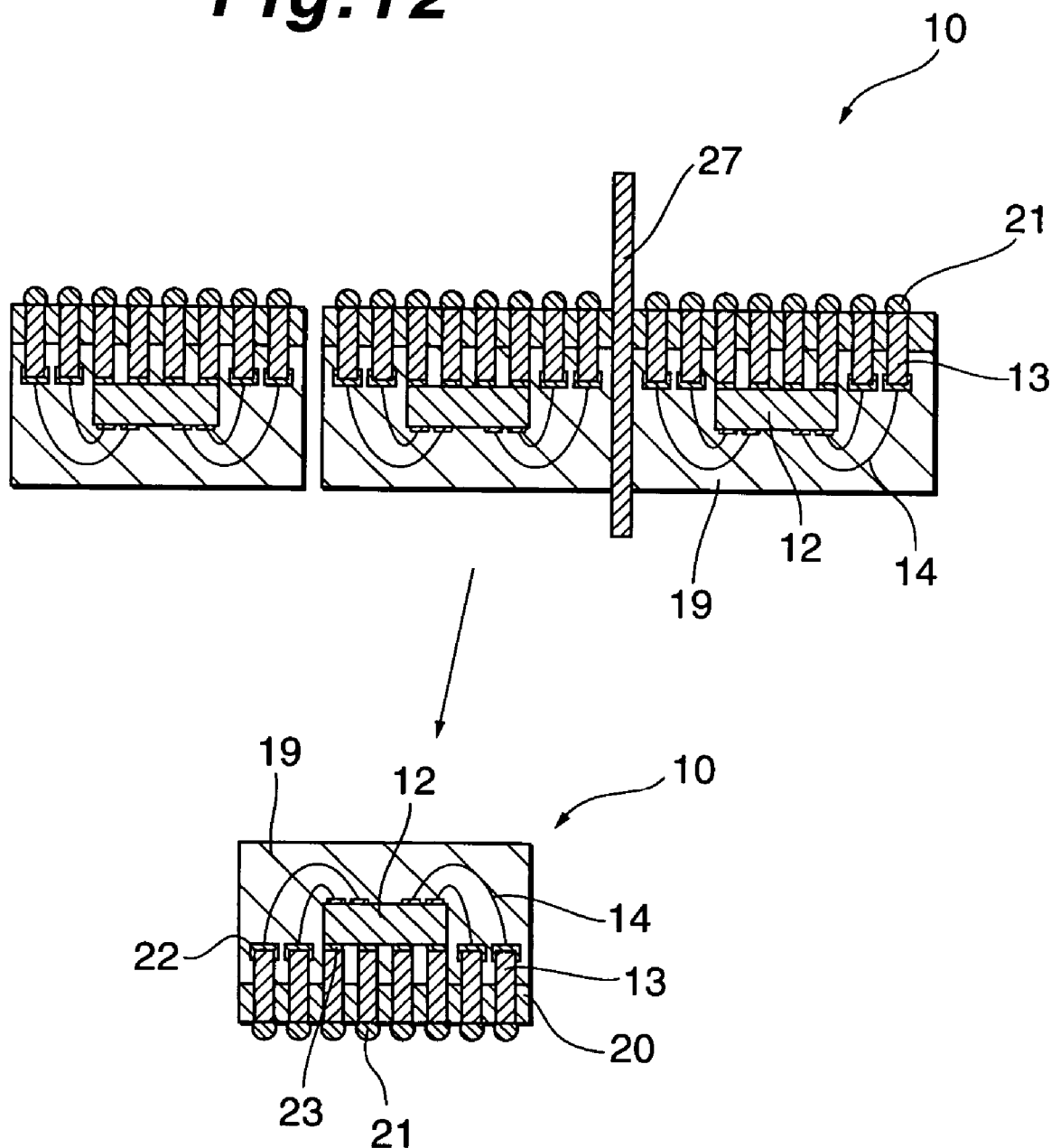
FIG. 12 is a sectional view showing formation of separating each semiconductor device from the sealed resin body; in the manufacturing method of semiconductor device of Embodiment 1.
Figure 13:
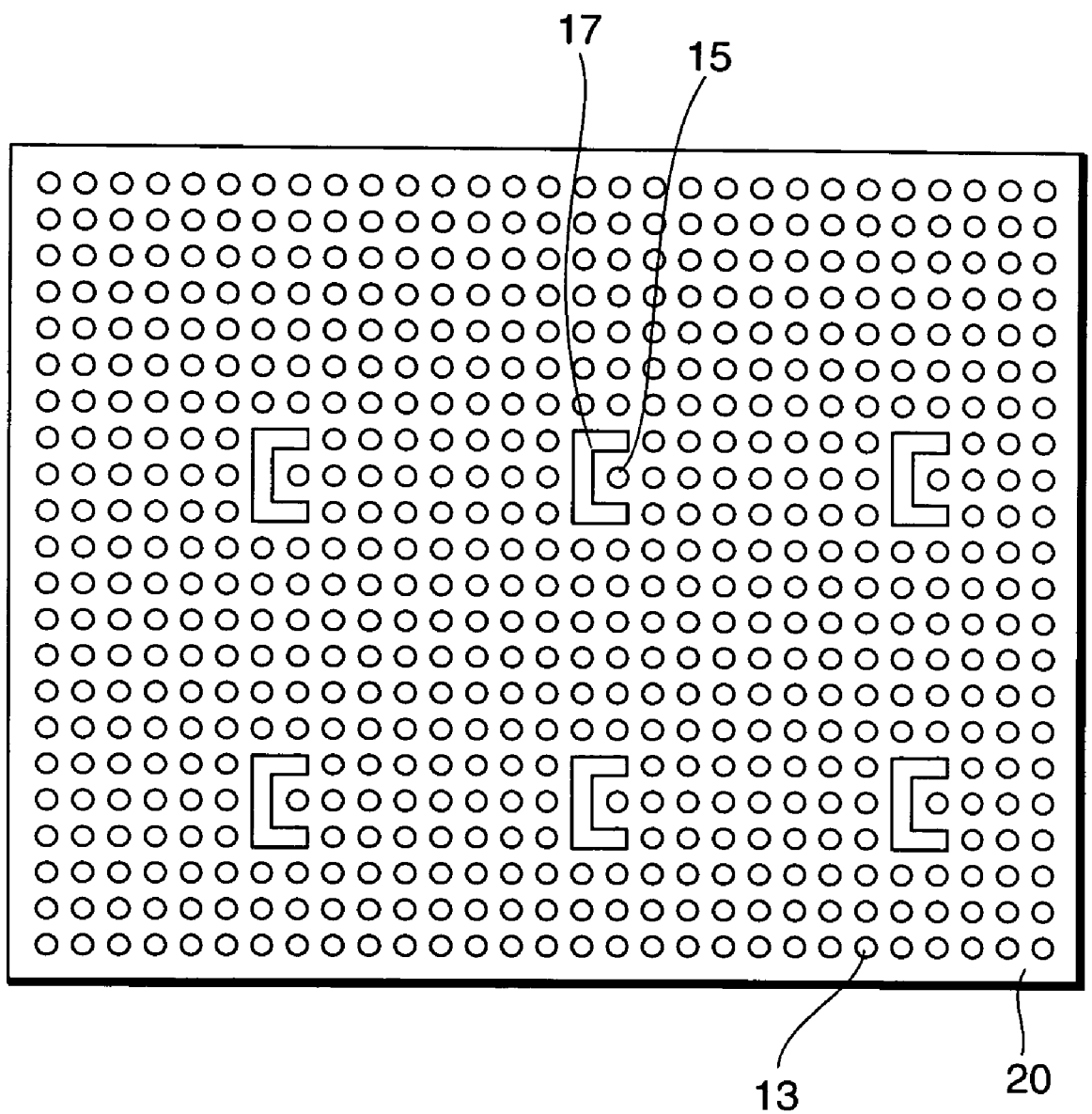
FIG. 13 is a plan view showing sealed resin body at its base; in the manufacturing method of semiconductor device of Embodiment 1.

After forming connecting portions 21, as shown in the sectional view of FIG. 12, the resin body is cut into a prescribed size of pieces with using a circular saw 27 of high revolution speed. Then, each semiconductor device 10 is formed. In this occasion, as shown in the plan view of FIG. 13, at the bottom surface of resin body, exposed are the end faces of post terminal 13, antenna terminal 15 and ground terminal 17. As is apparent in FIG. 13, ground terminal 17 has a peculiar form discriminated from the other terminals 15 and 13.

Therefore, when the resin body is divided into each semiconductor device 10, it can be cut in high accuracy by using the ground terminal 17 discriminated from the other terminals as a guide for positioning.

As described above, according to the manufacturing method of present invention, in the occasion when pellet 12 is positioned at a prescribed position, the ground terminal 17 discriminated from other terminals can be used as a guide for positioning. Thus, pellet 12 is positioned in high accuracy.

Moreover, according to the manufacturing method of present invention, in the occasion when resin body is divided into pieces, the ground terminal 17 discriminated from other terminals can be used as a guide for positioning. Thus, resin body is divided into pieces in high accuracy, so as to form each semiconductor device 10.

Further, according to the present invention, the conventional expensive apparatus of fluoroscopy to look through pellet 12 in resin body 19 is not needful to use. And, positioning of cutter to divide resin body is possible. So, equipment investment for manufacturing semiconductor device 10 of present invention becomes small.

And, according to the semiconductor device manufactured by the method of present invention, noise included in the signal line connected with the antenna terminal, can be removed by the ground terminal, which surrounds the antenna terminal in the form of square bracket.

<Embodiment 2>

Next, described is the other semiconductor device 100 formed by diverting the manufacturing method of present invention mentioned before.

Figure 14:
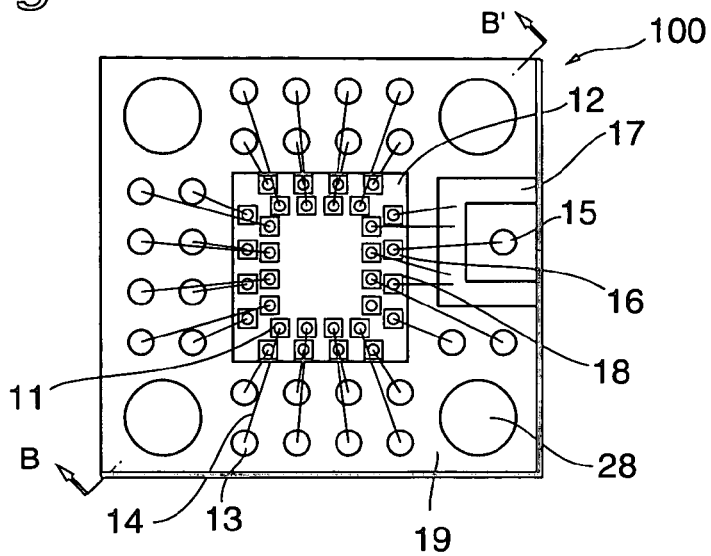
FIG. 14 is a perspective plan view of semiconductor device of Embodiment 2 at a prescribed depth.

FIG. 14 is a plan view looking at the top surface of semiconductor device 100 and looking through it at a prescribed depth.

The semiconductor device 100 differs from the semiconductor device 10 mentioned before in fixed reinforcement terminals to reinforce the fixing to the mother board.

The semiconductor device 100 of present invention comprises integrated circuit. And, it comprises a pellet 12 having plural electrodes 11 to input and output signals of the integrated circuit. Further, it comprises plural post terminals 13 to install the semiconductor device 10 on mother board and to input and output various signals. Here, top end of the post terminals 13 and the electrodes 11 are electrically connected with wires 14 for bonding. Further, the semiconductor device 100 comprises an antenna terminal 15 same as that of the semiconductor device 10 of Embodiment 1 mentioned before. And, said pellet 12 has an antenna electrode 16 connected with the antenna terminal 15. Besides, the semiconductor device 100 comprises a ground terminal 17 in the form of a square bracket, which surrounds the antenna terminal 15. And, said pellet 12 has plural ground electrodes 18 connected with the ground terminal 17. These elements of the semiconductor device 100 are sealed in a resin portion 19.

Further, the semiconductor device 100 of present invention comprises fixing reinforcement terminals 28 in forms of columns near every corner of the semiconductor device 100, sealed same as the post terminals 13.

The sectional area of the fixing reinforcement terminals 28 is formed larger than that of the post terminals 13. By this large sectional area, the contacting area of the semiconductor device 100 with the mother board becomes large.

Figure 15:
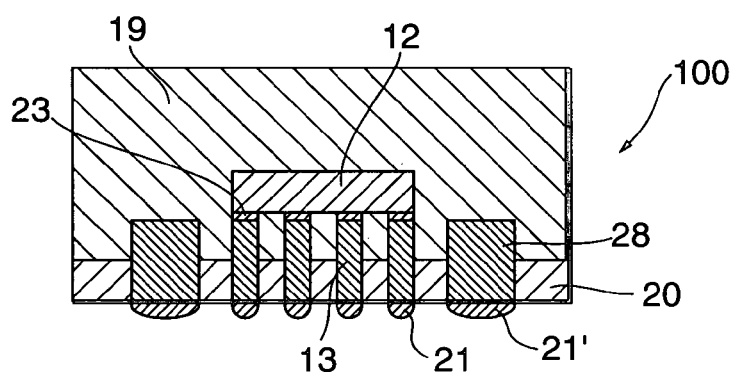
FIG. 15 is a sectional view of semiconductor device of Embodiment 2.

In the base of resin portion 19, a buffer layer 20 including glass fiber same as said mother board, is provided. Here, FIG. 15 shows a sectional view of the semiconductor device 100 of FIG. 14 at the position designated by the line B–B' in order to show the location of the fixing reinforcement terminals 28 of characteristic of present invention for the buffer layer 20 of the semiconductor device 100.

The pellet 12 is bound with the top end surfaces of terminals 13 beneath the bottom surface of the pellet 12 with binding material 23. At the bottom end surfaces exposed from the bottom surface of the buffer layer 20, formed are contacting portions 21 such as surface layers or solder balls etc. And, at the fixing reinforcement terminals 28, formed are similar contacting portions 21' as well. This contacting portions 21' are formed corresponding to the sectional area of the fixing reinforcement terminals 28. And, their areas are larger than those of the other contacting terminals 21 contacting with the mother board. By these large contacting areas, the semiconductor device 100 is strongly bound with the mother board.

Figure 16:
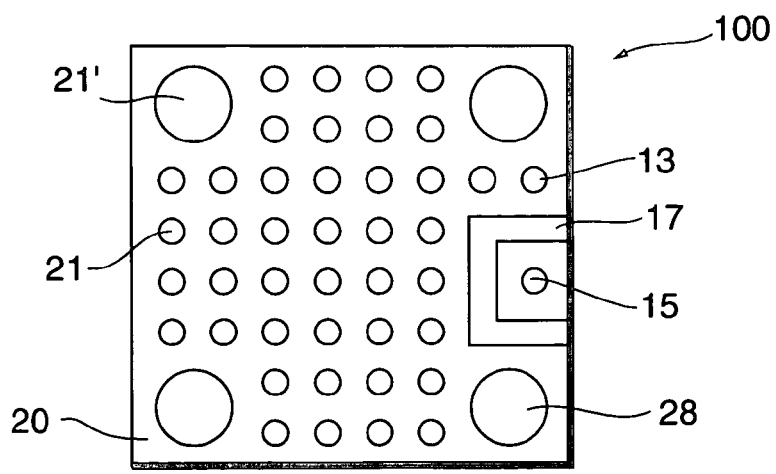
FIG. 16 is a plan view at the base of semiconductor device of Embodiment 2.

Next, the semiconductor device 100 of present invention is described referring to FIG. 16 showing the semiconductor device 100 at its bottom surface. In FIG. 16, the connecting portions 21 are formed on the bottom end surfaces of the terminals 13, 15 and 17 arrayed at the bottom surface of the buffer layer 20. The connecting portions 21' are formed on the bottom end surfaces of the fixing reinforcement terminals 28 arrayed near every corner of the semiconductor device 100.

The antenna terminal 15 is positioned at the center of the right end portion of semiconductor device 100 in the drawings. And, the periphery of antenna terminal 15 is surrounded with the bracket shaped ground terminal 17. At the bottom surfaces of antenna terminal 15 and ground terminal 17, connecting portions 21 are formed as well as the post terminals 13 (c.f. FIG. 15). And, these are connected to the ground terminals of said mother board. Therefore, similarly to the semiconductor device 10 mentioned above, noise included in the signal line connected to the antenna terminal 15 can be removed.

Here, the manufacturing method of the semiconductor device 100 is described. The fixing reinforcement terminals 28, which are characteristics of the semiconductor terminal 100, are formed by changing the mask pattern of terminals 13, 15 and 17 of Embodiment 1. That is, the fixing reinforcement terminals 28 together with the post terminals 13, antenna terminal 15 and ground terminal 17, shown in, for example FIG. 16, are formed by etching treatment of the conductive plate material 24. And, what is used for etching is the changed mask pattern; which is made from the mask pattern used for forming the semiconductor device 10 of Embodiment 1 mentioned before. The other treatments than changing of mask pattern are same as Embodiment 1. So, the same description is omitted.

As described above, according to the semiconductor device 100 of present invention, an effect of strongly binding the semiconductor device 100 to the mother board is obtained as well as the effect of removing noise from the signal line connected to the antenna terminal 15. Since, the fixing reinforcement terminals 28 are formed on the semiconductor device 100.

And, the semiconductor device 100 can be manufactured without special manufacturing apparatus, because the fixing reinforcement terminals 28 can be formed by the changed mask pattern.

<Embodiment 3>

Figure 17:
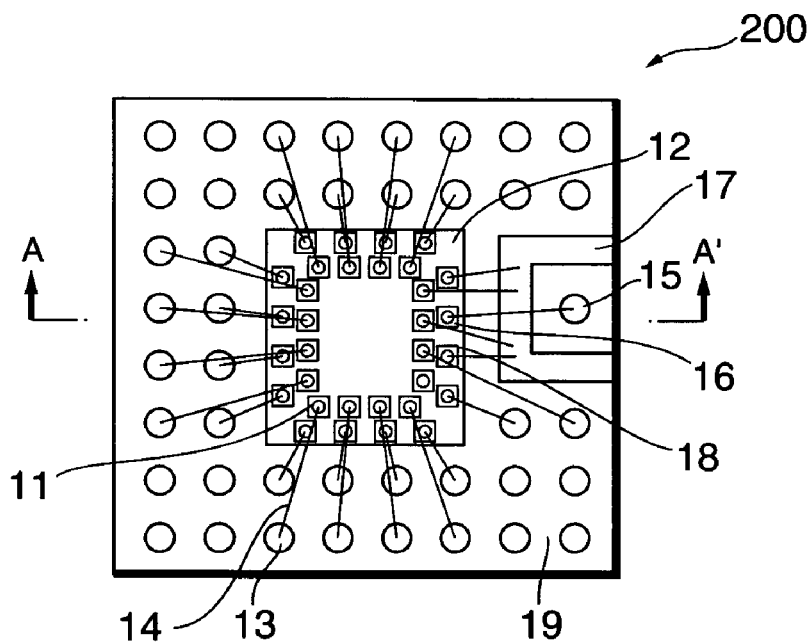
FIG. 17 is a perspective plan view of semiconductor device of Embodiment 3 at a prescribed depth.

Next, described is the other semiconductor device 200. FIG. 17 is a plan view looking at the top surface of semiconductor device 200 and looking through it at a prescribed depth.

Figure 18:
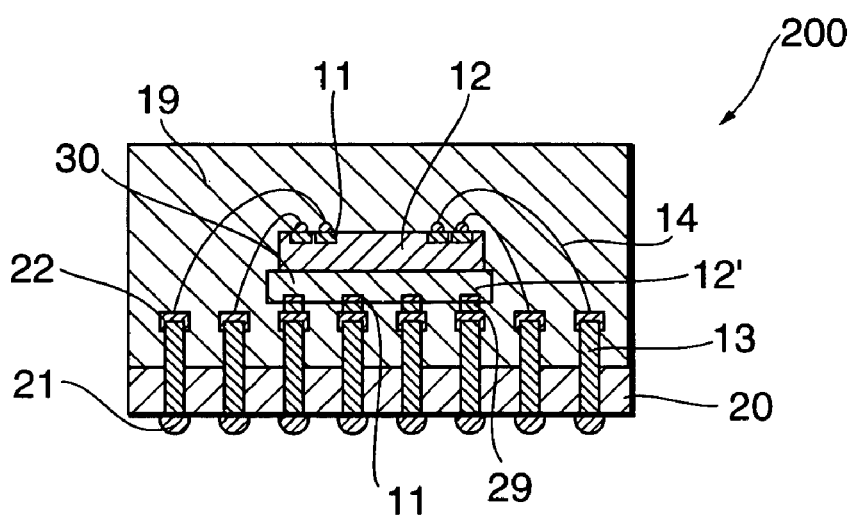
FIG. 18 is a sectional view of semiconductor device of Embodiment 3.

Here, in the semiconductor device 200 of FIG. 17, the sectional view at the line A–A' is shown in FIG. 18. And, the semiconductor device 200 is described, referring to FIG. 18 as well as FIG. 17.

The semiconductor device 200 has a pair of pellets 12 and 12'. And, this is the difference from the semiconductor device 10 mentioned before.

The semiconductor device 200 of present invention comprises integrated circuit. And, it comprises a pellet 12 having plural electrodes 11 to input and output signals of the integrated circuit. Further, it comprises plural post terminals 13 to install the semiconductor device 200 on mother board and to input and output various signals. Here, top end of the post terminals 13 and the electrodes 11 are electrically connected with wires 14 for bonding. Further, the semiconductor device 200 comprises an antenna terminal 15 same as that of the semiconductor device 10 of Embodiment 1 mentioned before. And, said pellet 12 has an antenna electrode 16 connected with the antenna terminal 15. Besides, the semiconductor device 200 comprises a ground terminal 17 in the form of a square bracket, which surrounds the antenna terminal 15. And, said pellet 12 has plural ground electrodes 18 connected with the ground terminal 17. These elements of the semiconductor device 200 are sealed in a resin portion 19.

Further, the semiconductor device 200 of present invention comprises the other pellet 12', which sticks to the bottom surface of pellet 12. And, conductive paste 30 consisting of silver, copper or gold etc. is sandwiched between two pellets 12, 12'. And, it comprises bump metals 29 to electrically connect the post terminals 13 with electrodes 11 at the bottom surfaces of pellet 12', by heat pressure welding. Further, it comprises gilding 22 formed on the top end surfaces of terminals 13, 15 and 17. And, in the base of resin portion 19, a buffer layer 20 including glass fiber same as said mother board, is provided. At the terminals 13, 15 and 17 exposed from the bottom surface of the buffer layer 20, formed are contacting portions 21 such as surface layers or solder balls etc.

As mentioned above, the electrodes 11 of pellet 12 of one side and the corresponding terminals are connected with wires 14 similarly as semiconductor device 10 of Embodiment 1 mentioned before. And, the electrodes 11 of pellet 12' of the other side are connected electrically with the post terminals 13 by heat pressure welding with bump metal 29. Therefore, integrity becomes high, because a pair of pellets of two stories is packaged.

Further, the semiconductor device 200 of present invention comprises an antenna terminal 15, as shown in FIG. 17. The antenna terminal 15 is positioned at the center of the right end portion of semiconductor device 100 in the drawings. And, the periphery of antenna terminal 15 is surrounded with the bracket shaped ground terminal 17. And, this is connected to the ground terminals of said mother board. Therefore, similarly to the semiconductor device 10 mentioned above, noise included in the signal line connected to the antenna terminal 15 can be removed.

The conductive paste 30 shown in FIG. 18 is electrically connected with the ground terminal 17 shown in FIG. 17. Besides, this ground terminal 17 is connected to the ground of mother board not shown in the drawings. Therefore, the conductive paste 30 interrupts each needless radiation (noise) of pellets 12, 12'. That is, the pellets 12, 12' are separated from each other by the conductive paste 30, which excludes noise coming from the other pellet. Thus, each operation of pellets 12, 12' is kept in stable condition.

Here, the manufacturing method of the semiconductor device 200 is described.

In the manufacturing method of the semiconductor device 200, similarly as the manufacturing method of the semiconductor device 10 mentioned above, an etching treatment is performed to a conductive plate material 24, so as to form the terminals 13, 15 and 17. And, a buffer layer 24 is formed. After this, gilding is performed on the top end surfaces of the terminals 13, 15 and 17. Until this, both methods are common.

After this, the other pellet 12' is stuck to a prescribed position where the terminals 13 with gilt are arrayed. This is performed with bump metal 29, which is stuck with heat and pressure.

Therefore, the bump metal 29 is preferably a conductive metal which can melt at a temperature lower than the melting temperature of the plate material 24 with terminals 13, 15 and 17.

After the other pellet 12' is stuck, the former pellet 12 is stuck to the other pellet 12' with conductive paste 30 such as silver paste etc. In this occasion, both back faces of these pellets are stuck, while both front faces of these pellets have electrodes. When this sticking is performed, one end of a conductive wire is caught between the former pellet 12 and the other pellet 12' with conductive paste 30. And, the other end of wire is connected to the ground terminal 17. After this, similarly the semiconductor device 10 mentioned before, the electrodes 11 of the former pellet and the terminals corresponding to the electrodes 11 are connected with wire. The other processes performed after this, are same as the manufacturing method of semiconductor 10. So, the same description is omitted.

As mentioned above, according to the semiconductor device 200 of present invention, the following effect is obtained as well as the effect of removing noise included in the signal line connected to the antenna terminal 15. That is, a pair of pellets 12, 12' are packaged in upper and lower layers. Thus, the base area of semiconductor device does not increase. And, the area occupied by semiconductor device 200 on mother board, becomes about half of the conventional device.

Further, according to the semiconductor device 200 of present invention, the operation of pellet is kept in stable condition. Since, conductive paste to connect pellets 12, 12' to ground terminal 17, shield needless radiation come from inside of pellets.

<Embodiment 4>

Next, a semiconductor device to attach with a socket of testing apparatus not shown in the drawings, is described. This testing apparatus is used for examining quality of semiconductor device 300. And, it has terminals 13, 15 and 17 projecting form the base of resin portion 17, so as to attach to the testing apparatus.

Figure 19:
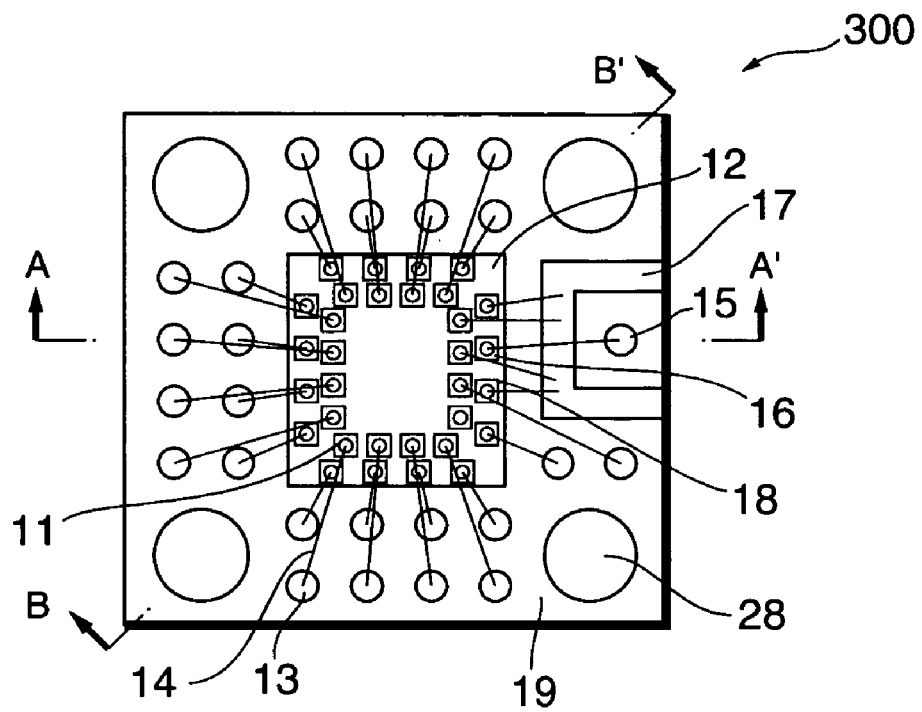
FIG. 19 is a perspective plan view of semiconductor device of Embodiment 4 at a prescribed depth.

FIG. 19 is a plan view showing the inner structure of semiconductor device 300 at a prescribed depth from the top surface of it.

The semiconductor device 300 of present invention installs integrated circuit. And, it comprises a pellet 12 having plural electrodes 11 for inputting and outputting of the integrated circuit; plural post terminal 13 to input and output various signals installed on a mother board not shown in the drawings; wire 14 for bonding to electrically connect top end of the post terminals 13 with electrodes of the pellet 12; an antenna terminal 15 same as the semiconductor device 10 mentioned before; an antenna electrode 16 formed on the pellet 12 to connect with the antenna terminal 15; a ground terminal 17 having a shape of square bracket surrounding said antenna terminal 15; plural ground electrodes 18 formed on the pellet 12 to connect to the ground electrode 18; fixing reinforcement terminals 28 in forms of column same as the terminals 13, 15 and 17, but the sectional area is larger than them; and resin portion 19 to seal all these members in resin.

Figure 20:
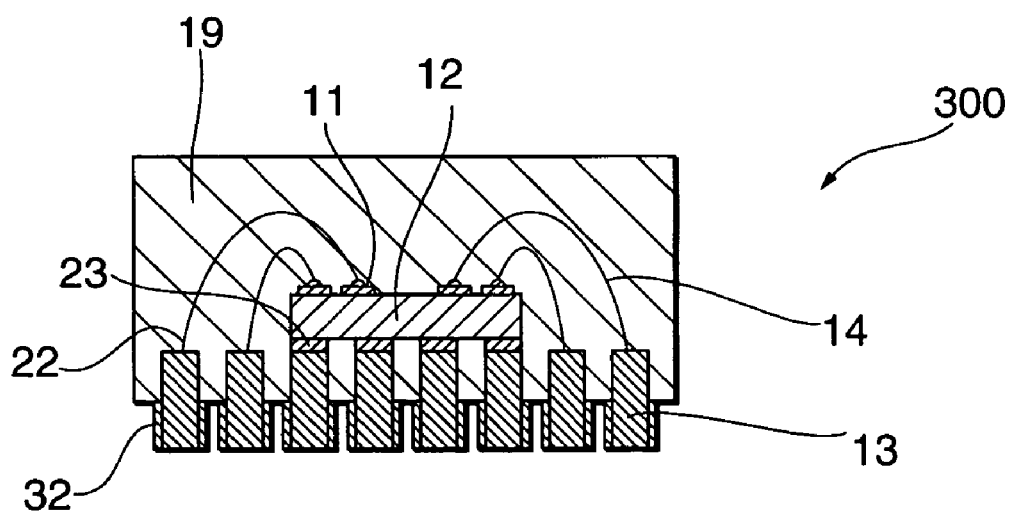
FIG. 20 is a first sectional view of semiconductor device of Embodiment 4.

Here, in the semiconductor device 300 of FIG. 19, the sectional view at A–A' line is shown in FIG. 20. And, the semiconductor device 300 is described referring to FIG. 20.

The semiconductor device 300 of present invention comprises binding material to bind pellet 12 at a prescribed position of top end of post terminals 13, and gilding 22 performed on the terminals 13, 15 and 17.

Cylindrical connecting portions 32 are formed on the peripheral walls of bottom ends of terminals 13, 15 and 17 with gilding 22; and fixing reinforcement terminals 28. And, the testing apparatus catches these cylindrical connecting portions 32 with a socket. Then, it performs various examination of the semiconductor device 300 before putting for sale.

Since examination before putting for sale is performed with various testing apparatus, each testing device has socket able to attach and detach the terminals 13, 15, 17 and 28. By this kind of socket, unlike the conventional apparatus, it is not necessary to stick connecting portion such as surface layer or solder ball etc. formed on the base surface of each terminal, with plural pins for examination. So, each connecting portion does not get any pin holes formed by each testing apparatus.

If many pin holes are formed on the connecting portion, the surface area on connecting portion needful for conducting decreases. And, electric resistance increases. So, the semiconductor device is not examined adequately. Further, owing to plural pin holes formed by each testing device, connection between testing pin and connecting portion becomes loose. So, the testing apparatus cannot examine the semiconductor device adequately. To solve problems mentioned above, the semiconductor device 300 of present invention has each terminal projected form the base surface of resin portion 19, so as to attach and detach socket without forming any pin holes.

Figure 21:
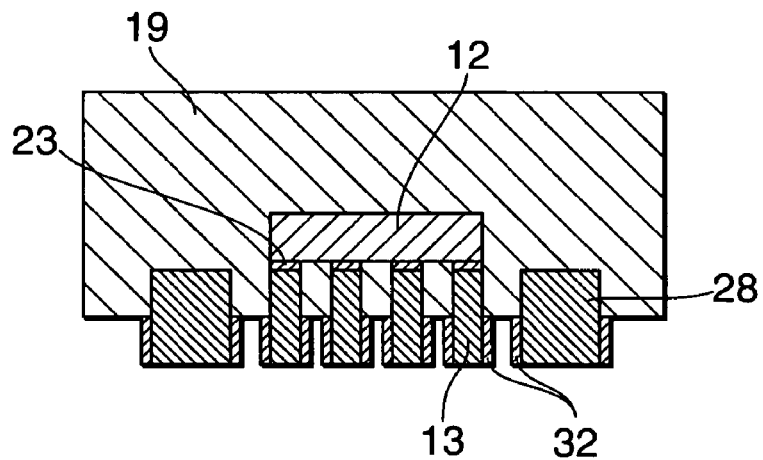
FIG. 21 is a second sectional view of semiconductor device of Embodiment 4.

Here, in the semiconductor device 300 of FIG. 19, its sectional view at B–B' line is shown in FIG. 21. Then the structure of semiconductor device 300 is shown in FIG. 21. However, the structure is already described. So, the same description is omitted.

The bottom end portion of each terminal to attach and detach the socket of testing device, is projected from the base surface of resin portion 19. Corresponding to the projected bottom end portion, the installing surface of mother board is formed, so as to install the semiconductor device 300. The semiconductor device 300 of present invention is strongly bound on the mother board by the fixing reinforcement terminals 28 with larger contacting area with the installing surface.

Figure 22:
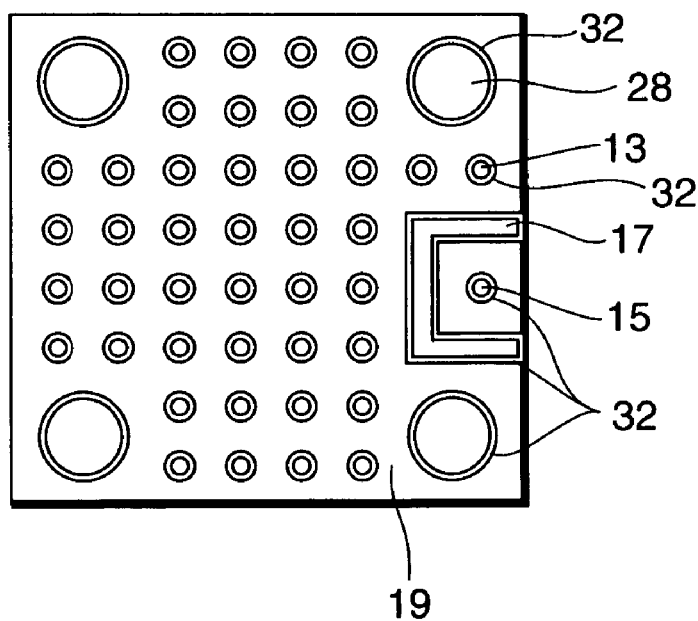
FIG. 22 is a plan view at the base of semiconductor device of Embodiment 4.

FIG. 22 is a plan view showing the semiconductor device 300 of present invention at its base surface.

The antenna terminals 15 of semiconductor device 300 is positioned at the center of right end portion of semiconductor device 300 in FIG. 22. And, the antenna terminal 15 is surrounded with bracket shaped ground terminal 17 in the periphery. Therefore, similarly as the semiconductor device 10 mentioned before, noise included in the signal line connected to the antenna terminal 15 can be removed. Since, the ground terminal 17 surrounding the antenna terminal 15 is connected to ground of mother board not shown in the drawings.

Next, the manufacturing method of the semiconductor device 300 mentioned above is described referring to the drawings.

Figure 23:
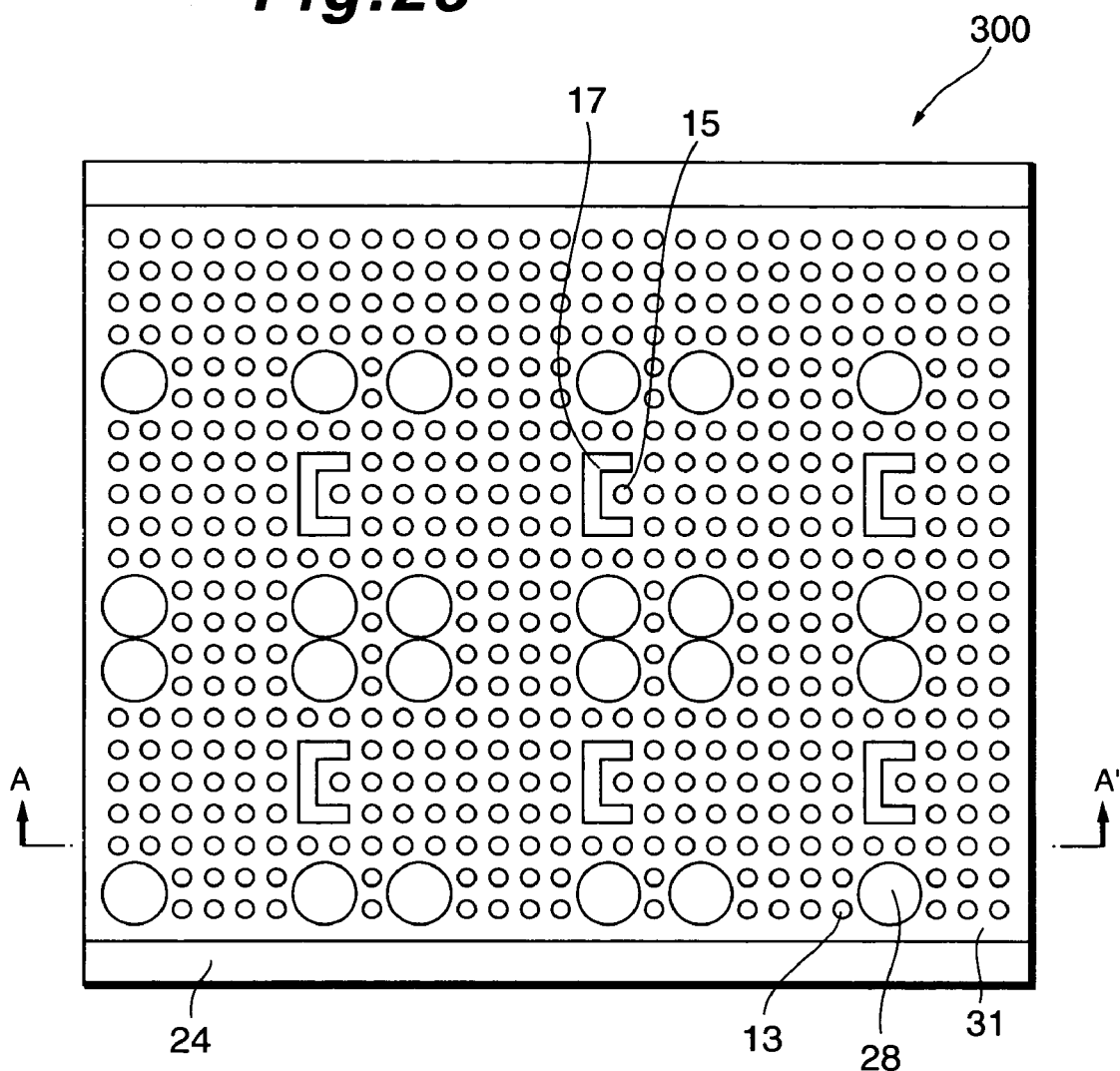
FIG. 23 is a plan view showing each terminal such as ground terminal formed from the board material, and solder layer; in the manufacturing method of semiconductor device of Embodiment 4.
Figure 24:
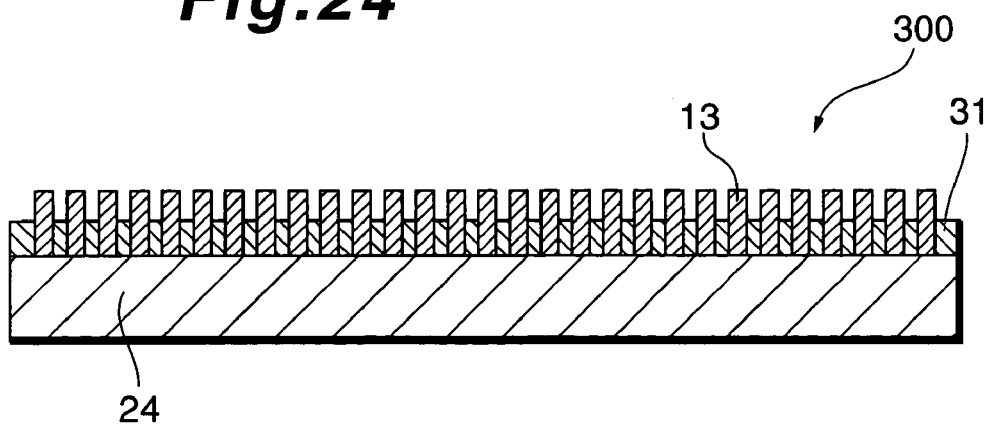
FIG. 24 is a sectional view showing each terminal such as ground terminal formed from the board material, and solder layer; in the manufacturing method of semiconductor device of Embodiment 4.

As shown in the plan view of FIG. 23 and the sectional view of FIG. 24 at A–A' line of FIG. 23, column shaped post terminals 13 are formed like a lattice on the one surface of conductive plate material 24 comprising chief element of copper. At the same time when the post terminals 13 are formed; a bracket shaped ground terminal 17 and an antenna terminal surrounded with the ground terminal 17 in the periphery, are formed on the one surface of plate material 24.

The plate material 24 has a uniform thickness of 50 $\mu$m to 400 $\mu$m for example. And, this plate material 24 gets a masking treatment to form the terminals 13, 15 and 17. Then, etching treatment is performed. By this treatment, post terminals 13, antenna terminals 15 and ground terminals 17 are formed at a time. Each height of terminals 13, 15 and 17 is set about one third of the thickness of said plate material 24.

In Embodiments mentioned above, the antenna terminal 15 is surrounded with the bracket shaped ground terminal 17. However, it is more satisfactory if the antenna terminal 15 is surrounded with ground terminal all around. Moreover, it is more satisfactory if the ground terminal 17 surrounding the antenna terminal 15 does not have any corner, like half circle, full circle etc. By this kind of ground terminal, noise included in the electric signal on the signal line connected with the antenna terminal 15 mentioned above, decreases more sufficiently.

After forming terminals 13, 15, 17 and 28; solder layer 31 is formed in the state of projecting each top end portion of the terminals 13, 15, 17 and 28. The solder layer 31 is formed with metal consisting chief element of solder. That is, this metal material is melted. And, the melted metal material is cooled to be solid on one face of the plate material 24 having the terminals. The melting temperature of solder is lower than the melting temperature of copper. That is, it is about 220° C. to 240° C. So; the plate material 24 comprising chief element of copper; and the terminals 13, 15, 17 and 28 formed from the plate material 24; are not melted by the heat of forming solder layer 31.

After forming solder layer 31, the surface of solder layer 31 and the terminals 13, 15, 17 and 28 are cleaned by cleaning liquid containing cleansing material, so as to remove dirt.

Figure 25:
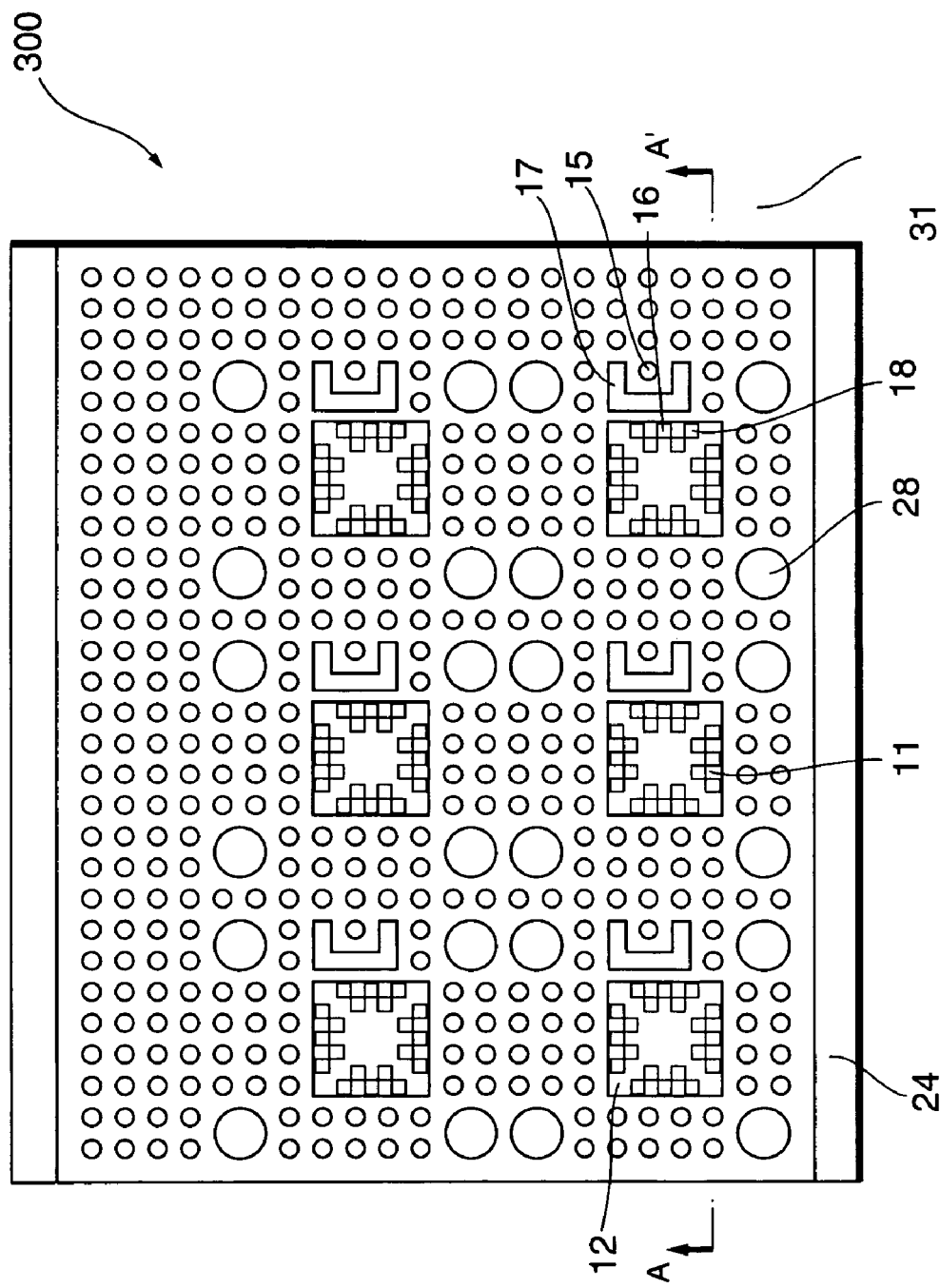
FIG. 25 is a plan view showing pellet located at a prescribed position; in the manufacturing method of semiconductor device of Embodiment 4.
Figure 26:
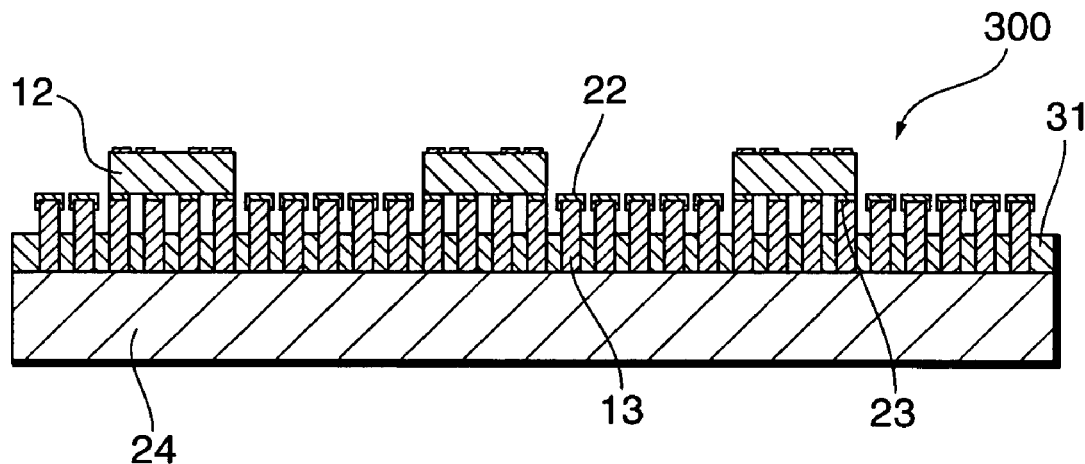
FIG. 26 is a sectional view showing pellet located at a prescribed position; in the manufacturing method of semiconductor device of Embodiment 4.

After removing dirt, as shown in a plan view of FIG. 25 and a sectional view of FIG. 26 at A–A' line in FIG. 25, gilding 22 is performed on the top end of each terminal. By this gilding 22, wire 14 is easily connected with the terminals 13, 15 and 17 in the bonding treatment of wire 14 mentioned later. And; loss of electricity between the terminal 13, 15 and 17; and wire; decreases.

After this, pellet 12 formed by the method known before this invention, is bound with binding material 23 at a prescribed position on the arrayed post terminal 13, with a guide of peculiar bracket shaped ground terminal 17 discriminated from the other terminals.

Therefore, the pellet 12 is bound at a prescribed position with high accuracy, owing to the positioning guide of ground terminal discriminated from the other terminals.

Figure 27:
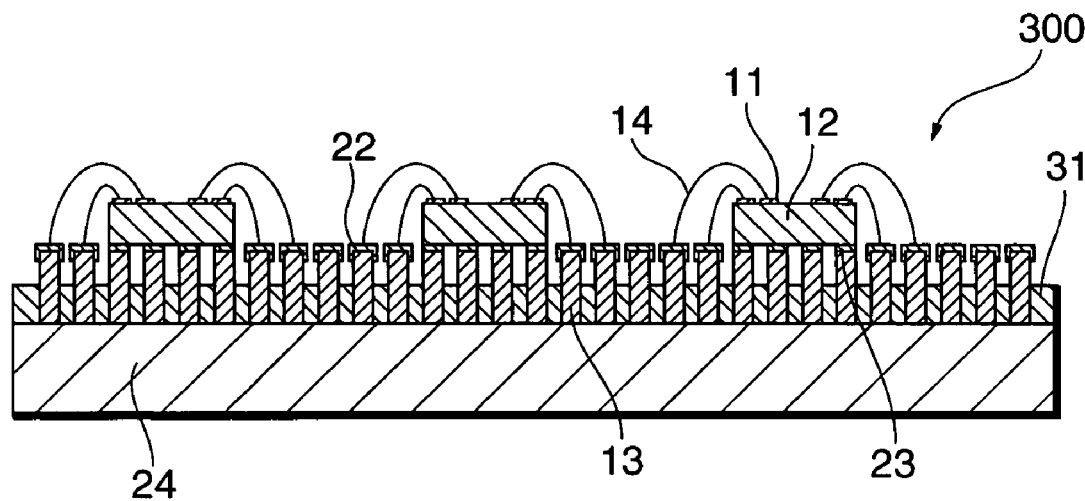
FIG. 27 is a sectional view showing pellet treated wire bonding; in the manufacturing method of semiconductor device of Embodiment 4.

As shown in a sectional view of FIG. 27, after binding pellet 12, each electrode of pellet 12, and the corresponding terminal 13, 15 and 17, are connected with wire 14.

In this occasion, though not shown in FIG. 27, the ground electrode 18 of each pellet 12 shown in FIG. 25 and the ground terminal 17 are connected with wire 14. And, the antenna electrode 16 and the antenna terminal 15 are connected with wire 14 as well (c.f. FIG. 19).

Figure 28:
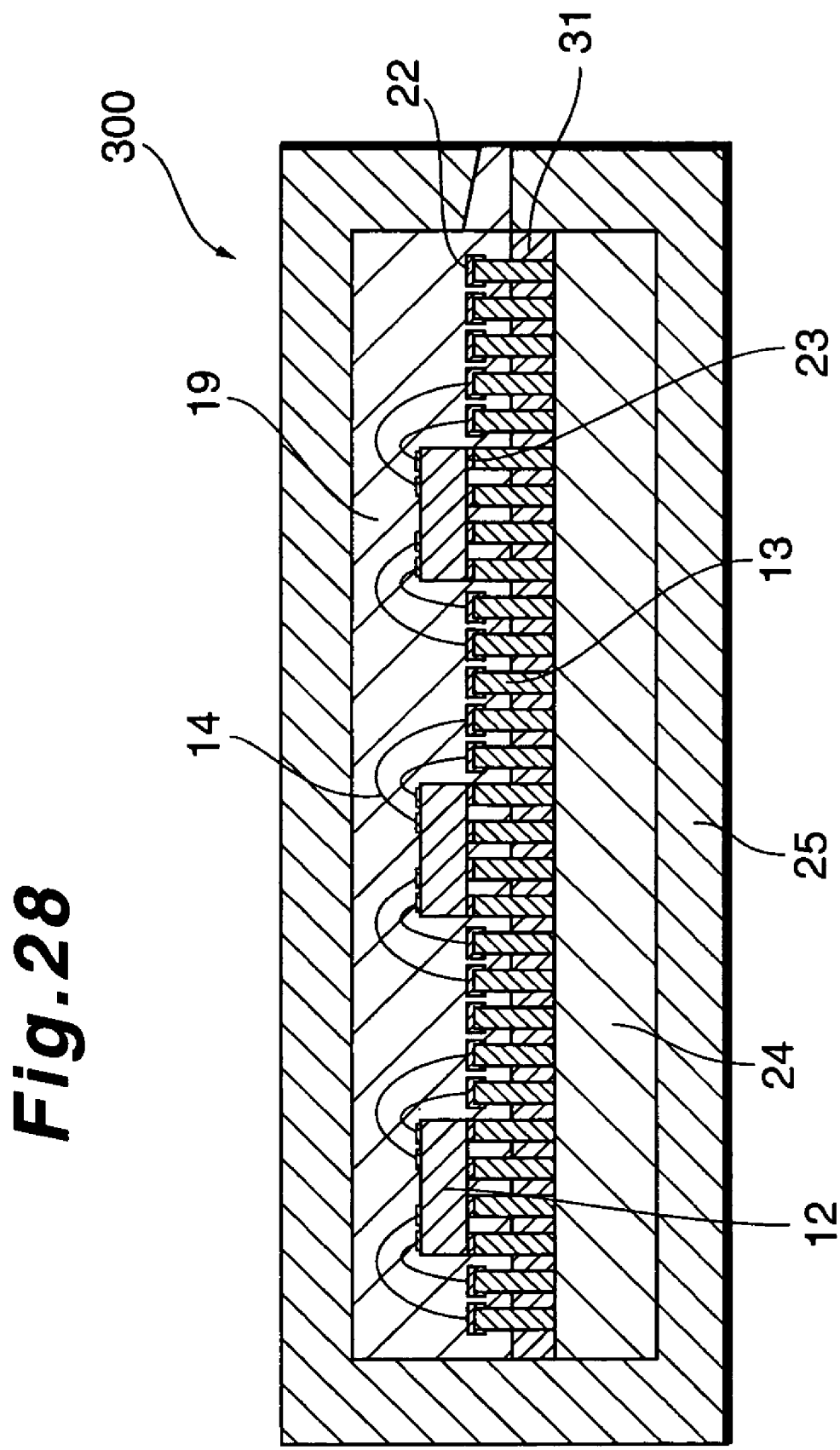
FIG. 28 is a sectional view showing sealed state of resin; in the manufacturing method of semiconductor device of Embodiment 4.

After performing wire bonding, as shown in a sectional view of FIG. 28, the semiconductor device is put on a metal mold 25 for sealing it with resin material. Then; the surface of solder layer 31; the terminals 13, 15, 17 and 28; pellet 12; and the wire 14; are sealed with resin portion 19. By this sealing, a resin sealed body including plural pellets 12, is formed.

Figure 29:
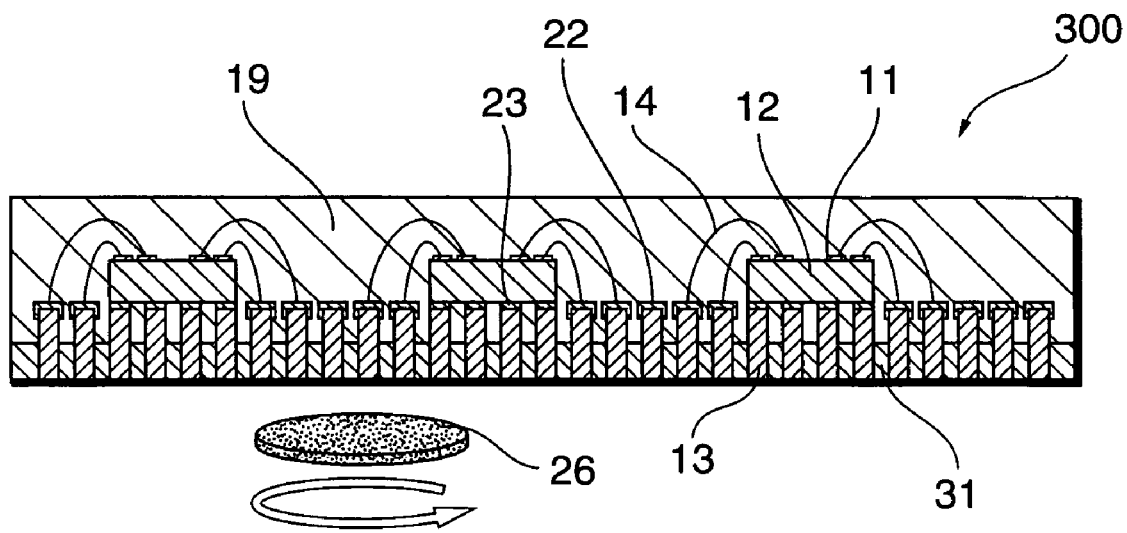
FIG. 29 is a sectional view showing the polishing process; in the manufacturing method of semiconductor device of Embodiment 4.

After forming a resin sealed body, it is taken out from the metal mold 25. And, as shown in FIG. 29, to remove the plate material 24, polishing is performed with a polisher 26 from the other face (base) of plate material to the bottom ends of the terminals 13, 15, 17 and 28. Thus, the plate material 24 is removed. And, the terminal 13, 15, 17 and 28 are exposed at the base of solder layer 20. Then, the terminals 13, 15, 17 and 28 are electrically separated with each other.

Figure 30:
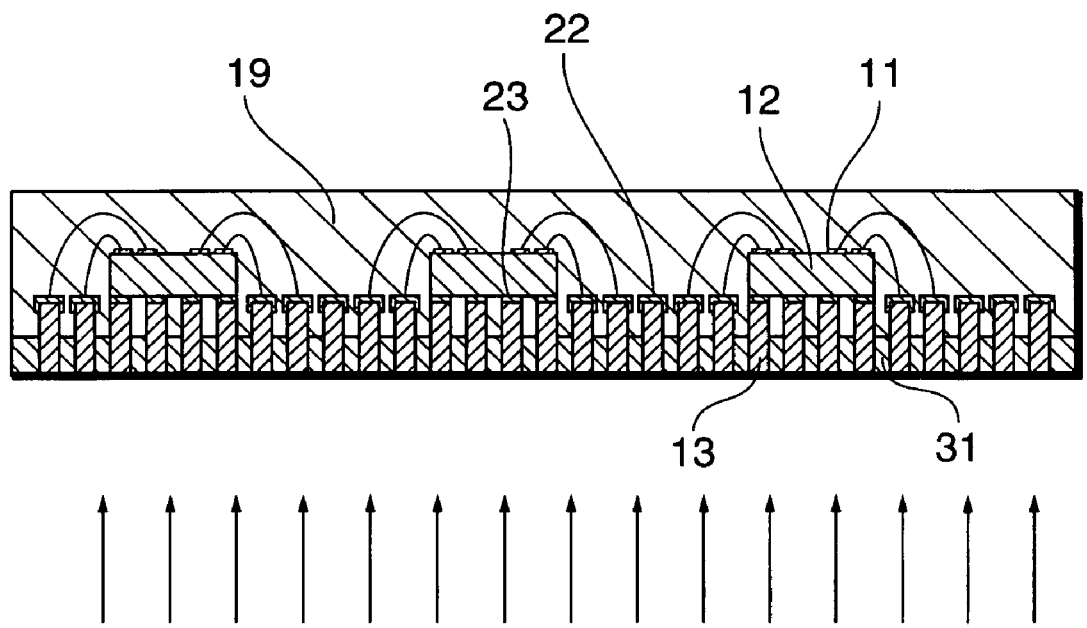
FIG. 30 is a sectional view showing heated solder layer; in the manufacturing method of semiconductor device of Embodiment 4.

After removing the plate material 24 by polishing, as shown in a sectional view of FIG. 30, the solder layer 31 is heated up from the base of the solder layer 31. By this heating, only the solder layer 31 is melted. Then, the resin sealed body is raised up by an apparatus not shown in the drawings. By this, the solder layer 31 is removed from each terminal and resin portion 19. In this occasion, the melted solder layer 31 remains at the side walls of terminals 13, 15, 17 and 28 projected from the base of resin portion 19 respectively. Thus, cylindrical connecting portions 32 are formed.

Figure 31:
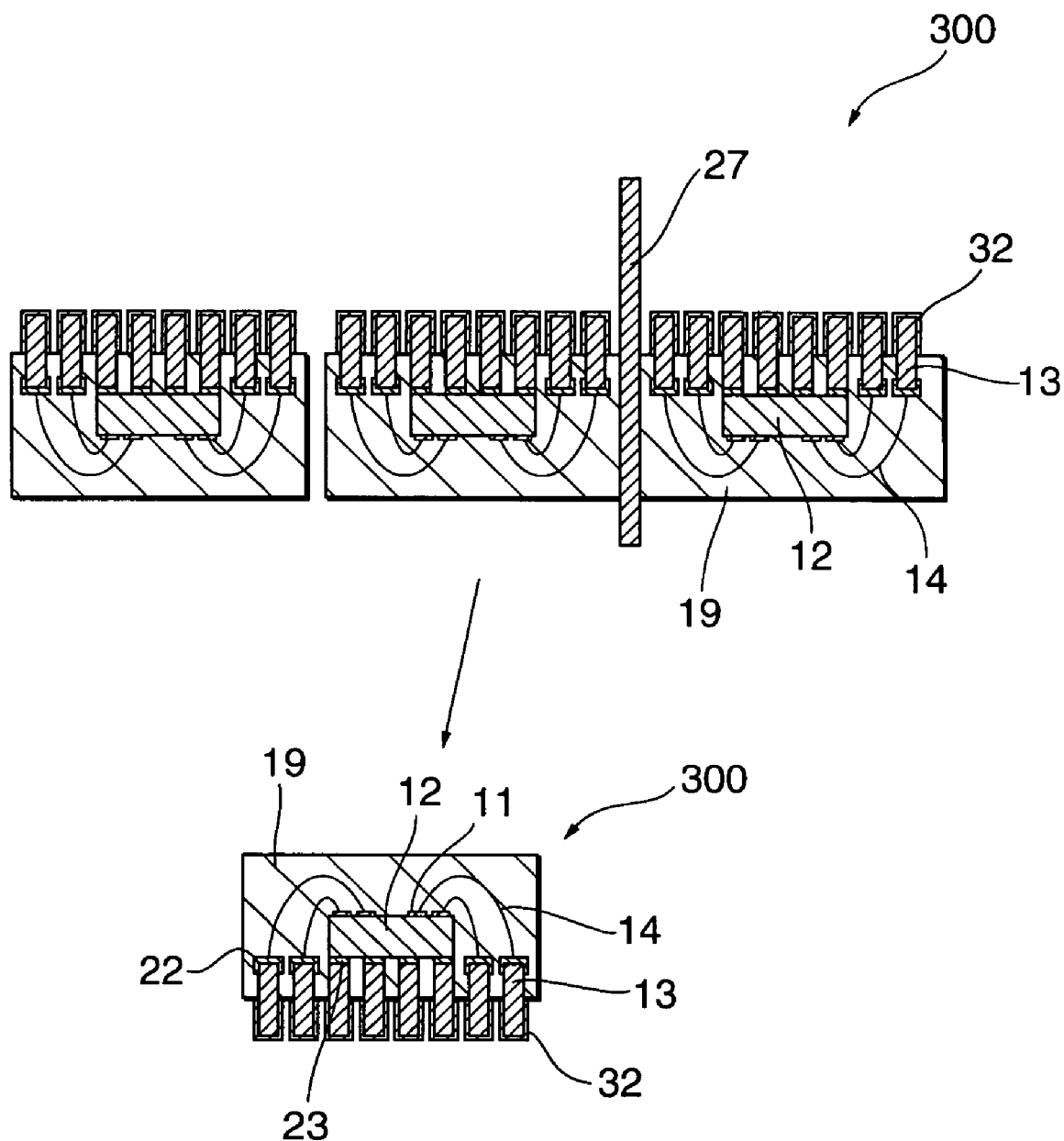
FIG. 31 is a sectional view showing formation of separating each semiconductor device from the sealed resin body; in the manufacturing method of semiconductor device of Embodiment 4.
Figure 32:
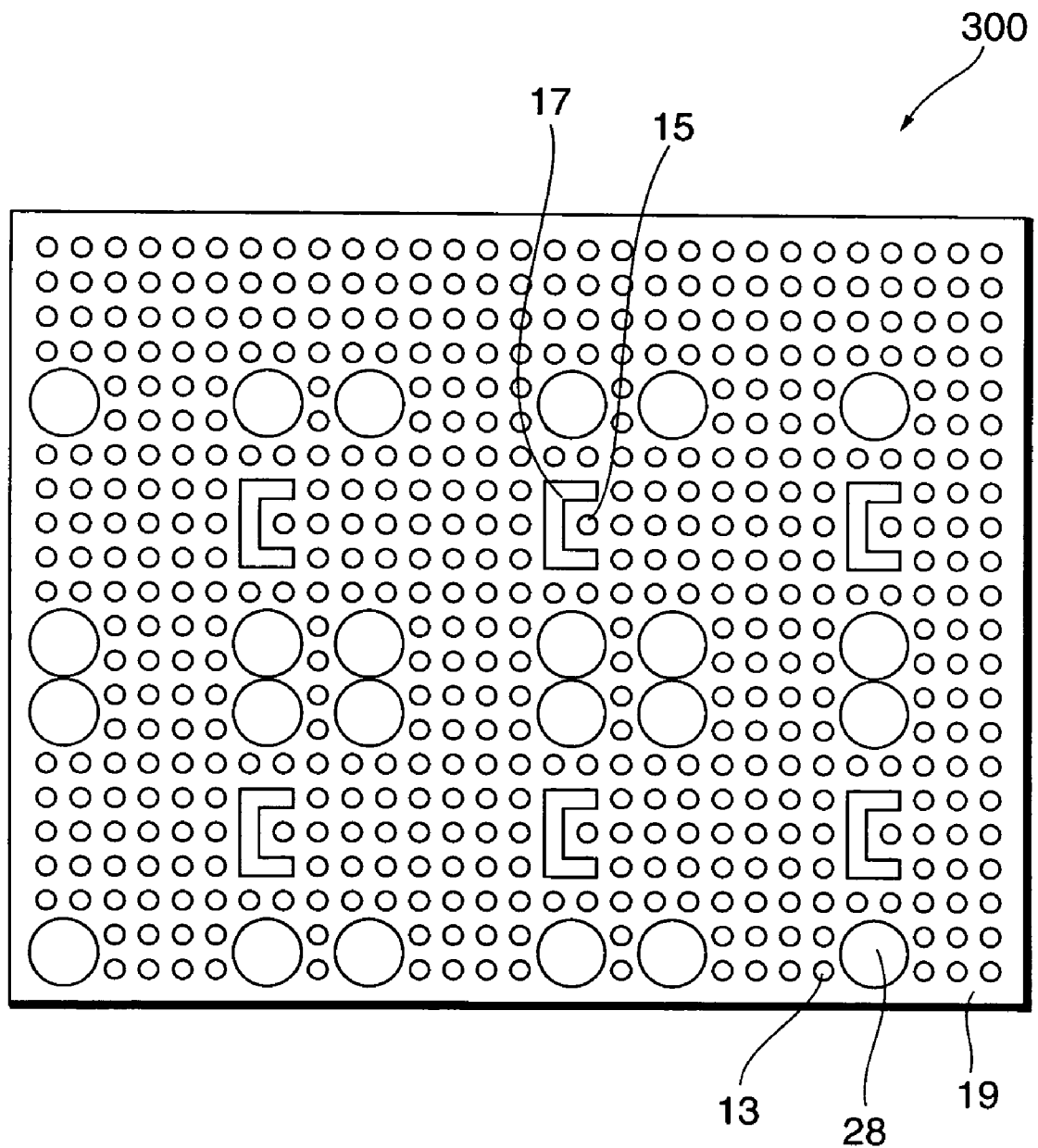
FIG. 32 is a plan view showing sealed resin body at its base, in the manufacturing method of semiconductor device of Embodiment 4.

After forming the cylindrical connecting portions 32, as shown in a sectional view of FIG. 31, the resin sealed portion is cut in a prescribed size with a circular saw 27 such as a high rotational speed saw etc. Then, each semiconductor device 300 is formed. In this occasion, as shown in a plan view of FIG. 32, the post terminals 13, an antenna terminal 15, a ground terminal 17, and fixing reinforcement terminals 28, are exposed. And, the bracket shaped ground terminal 17 becomes a guide for positioning. So, the resin sealed body is divided with high accuracy, so as to form each semiconductor device 300.

According to the manufacturing method of Embodiment 4, pellets 12 are put on a prescribed position with high accuracy, by using the ground terminal 17 discriminated from the other terminals as a guide for positioning pellets 12.

Further, according to the manufacturing method of present invention, the resin sealed body is divided with high accuracy, by using the ground terminal 17 as a guide for positioning the circular saw 27, so as to form each semiconductor device 300.

Further, according to the present invention, the equipment investment for manufacturing semiconductor device 300 of present invention is restrained, because it is possible to decide dividing position of the resin sealed body without any costly conventional apparatus to see pellets 12 though the resin portion 19.

According to the semiconductor device 300 manufactured by the method of present invention, as well as the effect of removing noise included in the signal line connected with the antenna terminal 15, obtained is an effect of examining the semiconductor device 300 sufficiently. Since, increase of electricity resistance or bad contact can be avoided by each terminal projected from the base of resin portion 19 of the semiconductor device 300, which is able to attach and detach the socket of testing apparatus, without causing any pin holes.

Incidentally, in Embodiments mentioned above, noise included in the signal line connected with antenna, is removed. However, noise included in the signal line connected with a receiver of infrared rays, is removed as well by the present invention.

Further, noise included in an electricity feeding line for operating the semiconductor device, or noise included in the operating clock, is removed as well by the present invention.

Moreover, noise in the semiconductor device is removed as well by the present invention. Since, the output terminal of signal including noise is surrounded by ground terminal, so as to prevent the noise from getting out of the semiconductor device when a signal is put out.

What is claimed is:

1. A semiconductor device, comprising:
   a pellet having a ground electrode; and
   an outside signal terminal connected to the pellet, so as to receive a signal which is likely to include noise; wherein
   at least a half of a periphery of said outside signal terminal is surrounded with a ground terminal that is connected to said ground electrode.

2. A semiconductor device according to claim 1, wherein said outside signal terminal receives the signal by an antenna mounted on the apparatus where the semiconductor device is installed.

3. A semiconductor device according to claim 1, wherein said outside signal terminal receives an operating clock from the apparatus where the semiconductor device is installed.

4. A semiconductor device according to claim 1, wherein said outside signal terminal receives an electricity source from the apparatus where the semiconductor device is installed.

5. A semiconductor device according to claim 1, wherein said ground terminal surrounds only half of the periphery of said outside signal terminal.

6. A semiconductor device according to claim 1, wherein said semiconductor device is provided with a fixing reinforcement terminal to reinforce the fixing of the semiconductor device to the apparatus installing it.

7. A semiconductor device according to claim 1, wherein said semiconductor device is provided with plural terminals for electrical connection, each terminal projecting at a base of the semiconductor device to connect with a socket.

8. A semiconductor device according to claim 1, wherein said semiconductor device is provided with a pair of semiconductor pellets; wherein at the base of one of the semiconductor pellets, the other semiconductor pellet is located;

and wherein electrodes of the other semiconductor pellet are connected with the plural terminals electrically.

9. A semiconductor device according to claim 8, wherein the pair of semiconductor pellets are fixed with each other at confronting faces with conductive paste that is electrically connected with said ground terminal.

* * * * *